(12) United States Patent
Park et al.

(10) Patent No.: US 10,943,954 B2
(45) Date of Patent: Mar. 9, 2021

(54) PANEL, DISPLAY DEVICE, AND VEHICLE-MOUNTED DISPLAY DEVICE

(71) Applicant: LG Display Co., Ltd., Seoul (KR)

(72) Inventors: Eun-Jung Park, Goyang-si (KR); Kwan-Soo Kim, Paju-si (KR); Ki-Min Lim, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/412,158

(22) Filed: May 14, 2019

(65) Prior Publication Data
US 2020/0006443 A1 Jan. 2, 2020

(30) Foreign Application Priority Data

Jun. 27, 2018 (KR) .................. 10-2018-0074364

(51) Int. Cl.
| | |
|---|---|
| *H01L 27/32* | (2006.01) |
| *H01L 51/50* | (2006.01) |
| *H01L 51/52* | (2006.01) |
| *H01L 27/12* | (2006.01) |

(52) U.S. Cl.
CPC ........ *H01L 27/3216* (2013.01); *H01L 27/322* (2013.01); *H01L 27/3211* (2013.01); *H01L 27/3218* (2013.01); *H01L 27/3262* (2013.01); *H01L 51/5044* (2013.01); *H01L 51/5218* (2013.01); *H01L 27/1214* (2013.01); *H01L 27/3276* (2013.01); *H01L 2251/5315* (2013.01)

(58) Field of Classification Search
CPC ............. H01L 27/3216; H01L 27/3218; H01L 27/322; H01L 51/5044; H01L 51/5218; H01L 51/5215; H01L 27/3211; H01L 2251/5315
See application file for complete search history.

(56) References Cited

U.S. PATENT DOCUMENTS

| | | | | |
|---|---|---|---|---|
| 2003/0071565 | A1* | 4/2003 | Hatwar | C09K 11/06 313/504 |
| 2005/0024293 | A1* | 2/2005 | Sakata | H01L 51/5262 345/30 |
| 2005/0110403 | A1* | 5/2005 | Han | H01L 27/3267 313/512 |
| 2012/0169683 | A1* | 7/2012 | Hong | H01L 27/3211 345/206 |
| 2013/0113843 | A1 | 5/2013 | Yamazaki | |
| 2014/0159037 | A1* | 6/2014 | Kwon | H01L 29/78618 257/43 |
| 2015/0102306 | A1 | 4/2015 | Shi et al. | |
| 2015/0144926 | A1* | 5/2015 | Lee | H01L 51/5265 257/40 |

(Continued)

OTHER PUBLICATIONS

European Patent Office, Extended European Search Report and Opinion, EP Patent Application No. 19176154.3, dated Nov. 21, 2019, eight pages.

*Primary Examiner* — Feifei Yeung Lopez
(74) *Attorney, Agent, or Firm* — Fenwick & West LLP

(57) ABSTRACT

Disclosed are a panel capable of performing transparent display, a display device and a vehicle-mounted display device. A transmission part includes an organic light-emitting diode so as to perform light emission as well as display, thereby increasing an emission area, reducing the driving voltage required for emission driving, and consequently increasing the lifespan of the display device.

22 Claims, 20 Drawing Sheets

(56) References Cited

U.S. PATENT DOCUMENTS

2016/0064458 A1    3/2016  Lee et al.
2017/0222173 A1*  8/2017  Matsusue ............ H01L 51/5044
2017/0294627 A1*  10/2017  Kim .................... H01L 51/5253

* cited by examiner

PANEL, DISPLAY DEVICE, AND VEHICLE-MOUNTED DISPLAY DEVICE

CROSS-REFERENCE TO RELATED APPLICATIONS

This application claims the benefit of Republic of Korea Patent Application No. 10-2018-0074364, filed on Jun. 27, 2018, which is hereby incorporated by reference as if fully set forth herein.

BACKGROUND OF THE INVENTION

Field of the Invention

The present invention relates to a display device capable of performing transparent display, and more particularly to a panel that is capable of performing transparent display and dual emission display at the same time, thereby improving transparency, an opening ratio, and the performance and lifespan of elements, a display device, and a vehicle-mounted display device.

Discussion of the Related Art

Recently, with the arrival of the information age, the field of displays for visually displaying electrically conveyed information signals has rapidly developed. In response thereto, various kinds of flat panel display devices having excellent characteristics, such as a small thickness, a low weight, and low power consumption, have been developed and have rapidly replaced existing cathode ray tubes (CRTs).

Representative examples of such flat panel display devices may include a liquid crystal display (LCD) device, a plasma display panel (PDP) device, a field emission display (FED) device, an organic light-emitting display (OLED) device, and a quantum dot display device.

Among these, a self-illuminating display device, such as an organic light-emitting display device or a quantum dot display device, is considered a competitive application because it does not require a separate light source and enables the realization of a compact device design and vivid color display.

Further, in recent years, there has been increasing demand for a transparent display device, which is configured to allow light to pass through the front and rear sides thereof and which is capable of displaying an image without obstructing the field of vision of a user.

Still further, studies are being conducted to achieve both self-illuminating display and transparent display through a change in the arrangement of a light-emitting diode.

However, high light emission efficiency is a top priority for a self-illuminating region, whereas high light transmittance is a top priority for a transparent region. That is, the self-illuminating region and the transparent region have different objectives from each other, and thus require different configurations from each other. Thus, it is difficult to form a structure capable of realizing both self-illuminating display and transparent display.

In the case in which a self-illuminating region and a transparent region are formed together on a substrate, elements such as a reflective electrode, which are required for the self-illuminating region, need to be eliminated from the transparent region in order to increase the light transmittance. Thus, the area of the self-illuminating region is reduced by the area occupied by the transparent region. Further, in order to realize self-illuminating display with a predetermined or higher brightness using the reduced self-illuminating region, a relatively high driving voltage is required. Still further, because only the self-illuminating region is consistently driven, the lifespan thereof is shortened.

SUMMARY OF THE INVENTION

Accordingly, the present invention is directed to a panel, a display device, and a vehicle-mounted display device that substantially obviate one or more problems due to limitations and disadvantages of the related art.

An object of the present invention is to provide a panel that is capable of performing transparent display and dual emission display at the same time, thereby improving transparency, an opening ratio, and the performance and lifespan of elements, a display device, and a vehicle-mounted display device.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

A panel, a display device and a vehicle-mounted display device of the present invention are characterized in that the display device is capable of performing transparent display and in that a transmission part includes an organic light-emitting diode for emitting light so that the transmission part as well as an emission part is used for light emission, thereby reducing the driving voltage required for emission driving and consequently increasing the lifespan of the display device.

To achieve these objects and other advantages and in accordance with the purpose of the invention, as embodied and broadly described herein, a display panel having a plurality of emission parts and a plurality of transmission parts includes a transparent substrate, a reflective anode in each of the emission parts, a transparent anode in each of the transmission parts, a first emission unit on the reflective anode, a second emission unit on the transparent anode, and a cathode provided on the first emission unit and the second emission unit. The transmission parts include a plurality of sub-emission parts at least some of which emitting lights having different colors from each other.

The sub-emission parts may include first, second, and third sub-emission layers configured to emit lights having first, second, and third wavelengths, respectively, the first wavelength being shorter than the second wavelength, and the second wavelength being shorter than the third wavelength.

The emission parts include first, second, and third emission parts configured to emit lights having different colors from each other. The first to third emission parts may include first, second, and third emission layers, respectively. Each of the first, second, and third emission layers may have the same host and the same dopant as a corresponding one of the first, second, and third sub-emission layers, respectively, in the transmission parts. In this case, a first organic common layer and a second organic common layer may be continuously provided under and on the first, second, and third emission layers, respectively, in the first emission unit and under and on the first, second, and third sub-emission layers, respectively, in the second emission unit.

Alternatively, the emission parts may include a first emission part and a second emission part configured to emit lights having different colors from each other. The first emission part and the second emission part may include first and second emission layers, respectively, in the first emission unit. Each of the first and second emission layers may have the same host and the same dopant as a corresponding one of any two of the first, second, and third sub-emission layers in the transmission part. In this case, a first organic common layer and a second organic common layer may be continuously provided under and on the first and second emission layers, respectively, in the first emission unit and under and on the first, second, and third sub-emission layers, respectively, in the second emission unit.

Each of the first emission unit and the second emission unit may include multiple stacks separated by at least one charge generation layer, and the stacks vertically disposed in each of the emission parts and the transmission parts may include emission layers configured to emit lights having the same color as each other.

The transmission parts include more second sub-emission layers than the first and third sub-emission layers. The first or the third sub-emission layer in the transmission parts occupies a smaller area than the second sub-emission layers.

Alternatively, the second sub-emission layer in the transmission parts occupies a larger area than first sub-emission layer or the third sub-emission layer.

The second emission unit may further include an optical compensation layer. Alternatively, the second emission unit may further comprise first, second, and third optical compensation layers in contact with the first, second, and third sub-emission layers, respectively. The first, second, and third optical compensation layers have different thicknesses from each other.

Each of the first emission unit and the second emission unit may include an organic stack configured to emit a white light, and at least one color filter is provided on the cathode so as to correspond to the emission parts.

In another example, the organic stack may include multiple stacks separated by at least one charge generation layer, and a plurality of emission layers configured to emit light having different colors from each other may be stacked in at least one of the stacks.

In this case, the second emission unit may further include an optical compensation layer provided in at least one of the stacks.

The multiple stacks including the at least one of charge generation layer and the emission layers may be continuously formed in the first emission unit and the second emission unit without separation.

The transmission parts, included in the transparent substrate, may have a total area greater than the total area of the emission parts.

The above-described panel may further include a first thin-film transistor electrically connected to the reflective anode and a second thin-film transistor electrically connected to the transparent anode, the first thin-film transistor and the second thin-film transistor being provided in a region other than the transmission parts, and may be used for a display device.

The display device may further include a bank layer between adjacent ones of the transmission parts, between adjacent ones of the emission parts, and between the transmission parts and the emission parts, and the bank layer is interposed between a layer of the transparent anode and the reflective anode and a stack of the first emission unit and the second emission unit.

The first thin-film transistor and the second thin-film transistor may be formed to overlap any one of the bank layer and the first emission unit.

In accordance with another embodiment of the present invention, a vehicle-mounted display device is mounted in a vehicle by attaching the above-described panel to the vehicle, the vehicle-mounted display device including a first thin-film transistor electrically connected to the reflective anode and a second thin-film transistor electrically connected to the transparent anode, wherein the first thin-film transistor and the second thin-film transistor are provided in a region other than the transmission parts in the transparent substrate.

The first thin-film transistor and the second thin-film transistor may be configured to receive power from a battery provided in the vehicle.

The panel may be configured to be attached to at least one of a dashboard, a removable display, a head-up display device, a front window, a room mirror, or a side mirror of the vehicle.

In another embodiment, a display device comprises a transparent substrate; a first light emitting element, a second light emitting element, and a third light emitting element on the transparent substrate, the first light emitting element, the second light emitting element, and the third light emitting element including a first reflective electrode, a second reflective electrode, and a third reflective electrode, respectively, and a first light emitting layer, a second light emitting layer, a third light emitting layer, respectively, on the first to third reflective electrodes, respectively; and a fourth light emitting element on the transparent substrate, the fourth light emitting element including a first transparent electrode and the first light emitting layer on the first transparent electrode.

In some embodiments, the display device may further comprise a fifth light emitting element on the transparent substrate, the fifth light emitting element including a second transparent electrode and the second light emitting layer on the second transparent electrode, the fourth and the fifth light emitting elements being separated by a scan line or a data line therebetween.

In some embodiments, the display may further comprise a fifth light emitting element on the transparent substrate, the fifth light emitting element including a second transparent electrode and the second light emitting layer on the second transparent electrode, the fourth and the fifth light emitting elements being surrounded by a pair of scan lines and a pair of data lines.

In some embodiments, the display device may further comprise a fifth light emitting element and a sixth light emitting element on the transparent substrate, the fifth light emitting element including a second transparent electrode and the second light emitting layer on the second transparent electrode, and the sixth light emitting element including a third transparent electrode and the third light emitting layer on the third transparent electrode, and wherein the fourth, the fifth, and the sixth light emitting elements are surrounded by a pair of scan lines and a pair of data lines.

In some embodiments, the fourth light emitting element further comprises an optical compensation layer.

In some embodiments, each of the first, the second, and the third light emitting elements comprises an organic stack configured to emit white light and further comprises a first color filter, a second color filter, a third color filter each associated with the first, the second, and the third light emitting elements, respectively, and the fourth light emitting element comprises another organic stack also configured to emit white light.

In some embodiments, the display device further comprises a first transistor, a second transistor, and a third transistor disposed on the transparent substrate so as not to overlap with the transparent electrode of the fourth light emitting element, wherein the first transistor, the second transistor, and the third transistor are electrically connected to the first light emitting element, the second light emitting element, and the third light emitting element, respectively; and a fourth transistor disposed on the transparent substrate so as not to overlap with the transparent electrode of the fourth light emitting element, wherein the fourth transistor is electrically connected to the fourth light emitting element.

In some embodiments, the first to the fourth transistors are configured to receive power from a battery provided in the vehicle, the display device being attached to at least one of a dashboard, a removable display, a head-up display device, a front window, a room mirror, or a side mirror of the vehicle.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Figure 1:
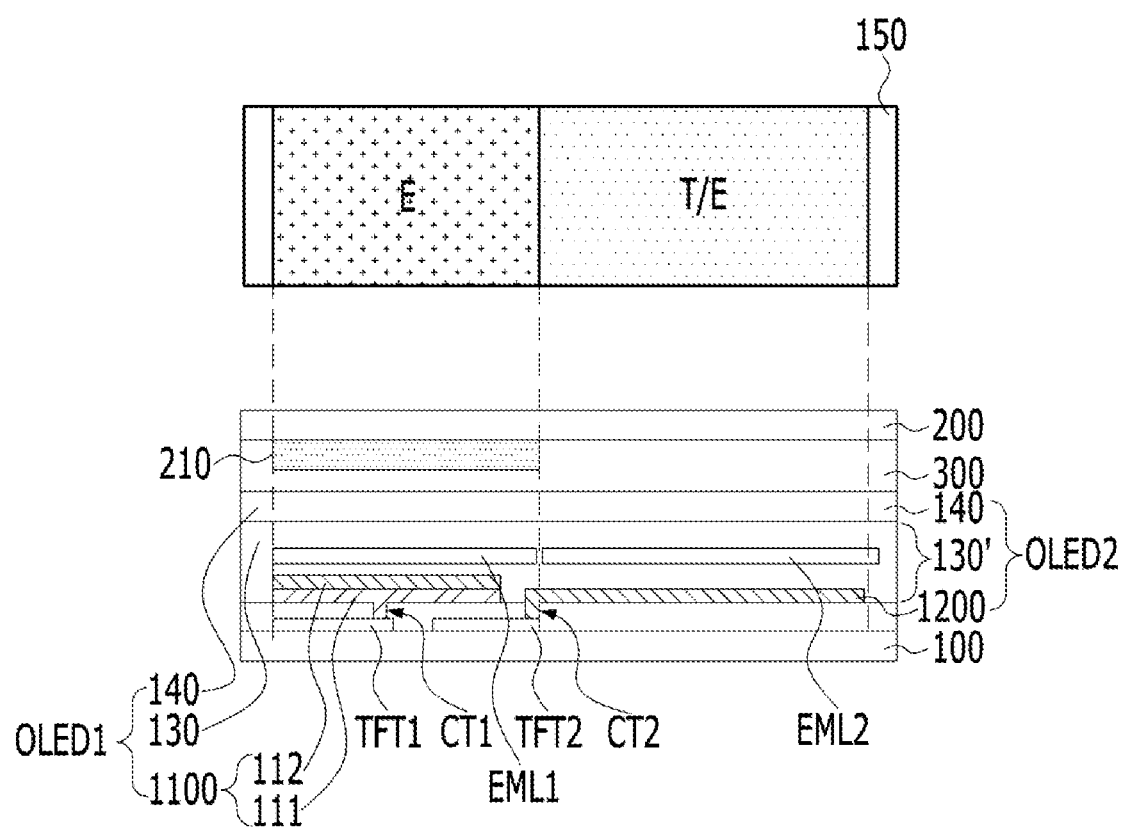
FIG. 1 is a cross-sectional view schematically illustrating an emission part and a transmission part of a display device of the present invention.

Reference will now be made in detail to the preferred embodiments of the present invention, examples of which are illustrated in the accompanying drawings. The same reference numerals used throughout the specification refer to the same or like parts. In the following description of the present invention, a detailed description of known functions and configurations incorporated herein will be omitted when it may make the subject matter of the present invention rather unclear. Names of components used in the following description are selected in consideration of facility of specification preparation. Thus, the names of the components may be different from names of components used in a real product.

In the drawings for explaining the exemplary embodiments of the present invention, for example, the illustrated shape, size, ratio, angle, and number are given by way of example, and thus, are not limited to the disclosure of the present invention. Throughout the present specification, the same reference numerals designate the same constituent elements. In addition, in the following description of the present invention, a detailed description of known functions and configurations incorporated herein will be omitted when it may make the subject matter of the present invention rather unclear. The terms "comprises", "includes", and/or "has", used in this specification, do not preclude the presence or addition of other elements unless used along with the term "only". The singular forms are intended to include the plural forms as well, unless the context clearly indicates otherwise.

In the interpretation of constituent elements included in the various embodiments of the present invention, the constituent elements are interpreted as including an error range even if there is no explicit description thereof.

In the description of the various embodiments of the present invention, when describing positional relationships, for example, when the positional relationship between two parts is described using "on", "above", "below", "next to", or the like, one or more other parts may be located between the two parts unless the term "directly" or "closely" is used.

In the description of the various embodiments of the present invention, when describing temporal relationships, for example, when the temporal relationship between two actions is described using "after", "subsequently", "next", "before", or the like, the actions may not occur in succession unless the term "directly" or "just" is used therewith.

In the description of the various embodiments of the present invention, although terms such as, for example, "first" and "second" may be used to describe various elements, these terms are merely used to distinguish the same or similar elements from each other. Therefore, in the present specification, an element indicated by "first" may be the same as an element indicated by "second" without exceeding the technical scope of the present invention, unless otherwise mentioned.

The respective features of the various embodiments of the present invention may be partially or wholly coupled to and combined with each other, and various technical linkages and modes of operation thereof are possible. These various embodiments may be performed independently of each other, or may be performed in association with each other.

FIG. 1 is a cross-sectional view schematically illustrating an emission part and a transmission part of a display device of the present invention.

As illustrated in FIG. 1, the display device of the present invention includes a transparent substrate 100 having a plurality of emission parts E and a plurality of transmission parts T/E, which are provided separately from each other, a reflective anode 1100 provided in each of the emission parts E, a transparent anode 1200 provided in each of the transmission parts T/E, a first emission unit 130 provided on the reflective anode 1100, a second emission unit 130' provided on the transparent anode 1200, the second emission unit 130' being disposed parallel to the first emission unit 130 in a planar manner, and a cathode 140 provided on the first emission unit 130 and the second emission unit 130'.

The display device of the present invention is characterized in that both the transmission part T/E and the emission part E are configured to emit light so as to increase the light emission efficiency of the display device. The transmission part T/E is so named due to its characteristics of being transparent in a voltage-off state. However, the transmission part T/E of the present invention acts not only as a transmission part in a voltage-off state, but also as an auxiliary emission part in a voltage-on state, in which light is emitted. That is, in a voltage-off state, the transmission part becomes colorless and transparent like a transparent film so that the configuration under the transmission part is visible, and in a voltage-on state, the transmission part emits a colored light while maintaining transmissive properties.

Figure 2:
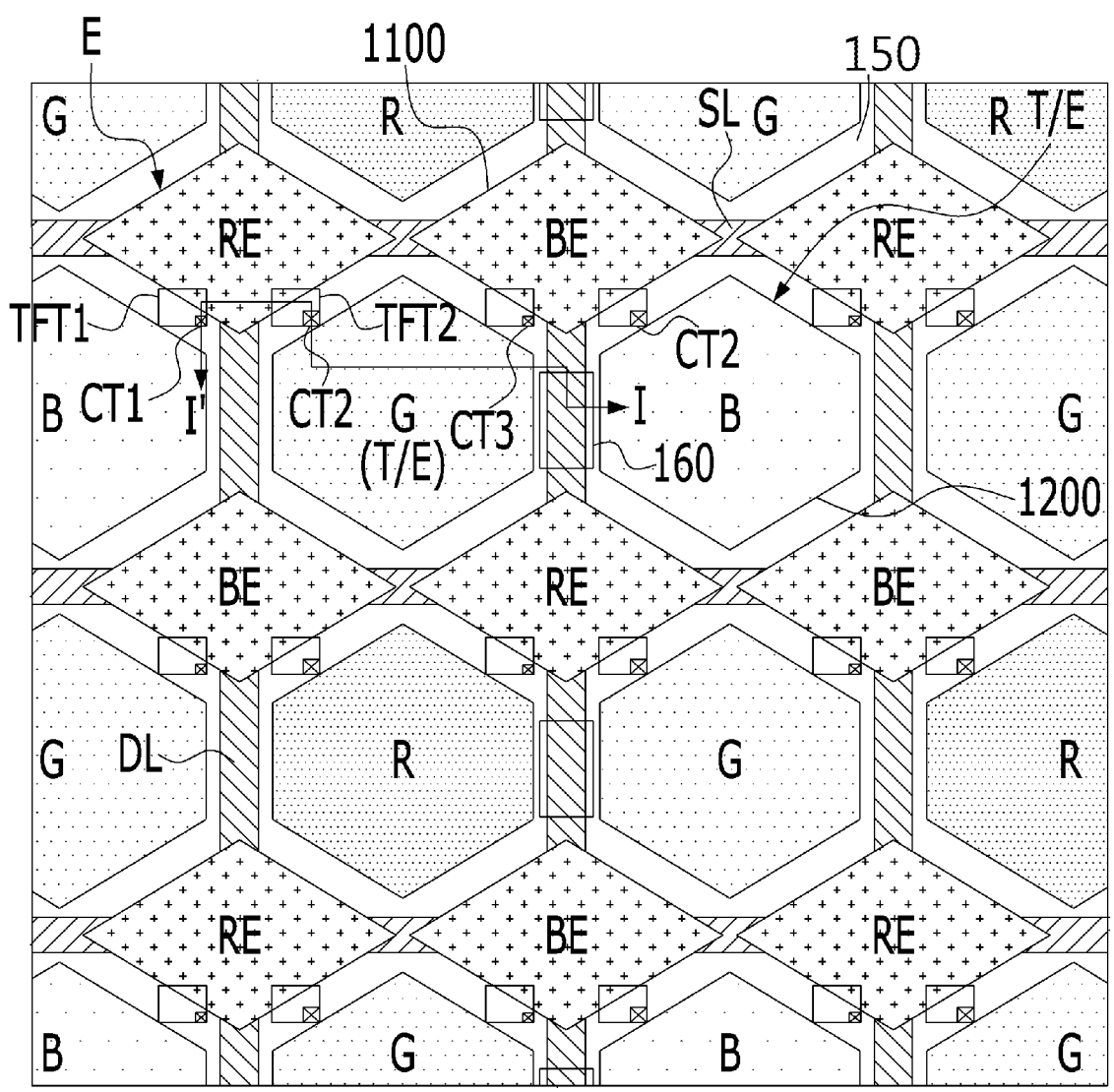
FIG. 2 is a plan view of a display device according to a first embodiment of the present invention.

As illustrated in FIG. 1 and FIG. 2, a bank layer 150 is formed on the edges of the emission part E and the transmission part T/E in order to divide the emission part E and the transmission part T/E from adjacent parts. Depending on the embodiment, the bank layer 150 may be omitted, or may be further provided between the emission part E and the transmission part T/E. The circuit elements, such as thin-film transistors TFT 1 and TFT 2 and lines SL and DL (refer to FIG. 2), are shielded by the bank layer 150 so as not to affect the transparent display.

In order to more effectively prevent the colored light emitted from the emission part E or the transmission part T/E from being mixed with the colored light emitted from an adjacent part, it may be desirable that the emission part E and the transmission part T/E be arranged parallel to each other in a planar manner and be spaced apart from each other so that the bank layer 150 is formed therebetween. Thus, in the case in which the emission part E and the transmission part T/E are spaced apart from each other, the bank layer 150 may be formed between the emission part E and the transmission part T/E. Alternatively, even when the bank layer 150 is not formed, the emission part E and the transmission part T/E may be divided from each other by the division of the reflective anode 1100 and the transparent anode 1200 from each other, thereby making it possible to independently drive the emission part E and the transmission part T/E.

To this end, the display device of the present invention is configured such that the emission part E includes a first organic light-emitting diode OLED1 and the transmission part T/E includes a second organic light-emitting diode OLED2.

In addition, in order to drive the first and second organic light-emitting diodes OLED1 and OLED2, the display device of the present invention may further include a first thin-film transistor TFT1, which is electrically connected to the reflective anode 1100, and a second thin-film transistor TFT2, which is electrically connected to the transparent anode 1200. The first and second thin-film transistors TFT1 and TFT2 may be disposed in a region (the emission part E or the bank layer 150) other than the transmission part T/E in the transparent substrate 100. The reason why the second thin-film transistor TFT2, provided to drive the transmission part T/E, is disposed in a region other than the transmission part T/E is to prevent the transparency of the transmission part T/E from being deteriorated by the second thin-film transistor TFT2, which is mainly constituted of lines.

In the case in which the bank layer 150 is formed between the emission part E and the transmission part T/E, the first and second thin-film transistors TFT1 and TFT2 may be disposed under the bank layer 150 as well as in the emission part E.

The first thin-film transistor TFT1 and the second thin-film transistor TFT2 are electrically disconnected from each other, and independently apply signals to the reflective anode 1100 and the transparent anode 1200, respectively.

The cathode 140 is made of reflective-transmissive or transmissive transparent metal, and is continuously formed over the emission part E and the transmission part T/E without an interruption therein. In order to inject electrons into the first and second organic light-emitting diodes OLED1 and OLED2, the cathode 140 may include a metal alloy layer having a transmittance of 70% or greater for a wavelength of 520 nm. In the case in which the cathode 140 is made of reflective metal, the cathode 140 may be made of an alloy including at least one of Ag, Mg, or Yb. In the case in which the cathode 140 is made of transmissive metal, the cathode 140 may be made of indium zinc oxide (IZO). The thickness of the cathode 140 may be set differently in consideration of the surface resistance and the injection of electrons depending on whether the cathode 140 is made of reflective metal or transmissive metal.

The first organic light-emitting diode OLED1 of the emission part E has a top-emission-type structure that includes the reflective anode 1100, the first emission unit 130 and the cathode 140, which are sequentially arranged from the bottom of the first organic light-emitting diode OLED1. The second organic light-emitting diode OLED2 of the transmission part T/E has a structure in which the transparent anode 1200, the second emission unit 130' and the cathode 140 are stacked on one another in order to maintain transparency.

In the first and second organic light-emitting diodes OLED1 and OLED2, the cathode 140 is commonly provided in the emission part E and the transmission part T/E without intermittence or separation, the reflective anode 1100 is provided in the emission part E, and the transparent anode 1200 is provided in the transmission part T/E. A transparent electrode material that forms the transparent anode 1200 may also be included in a transparent electrode layer 112, which is in contact with a reflective electrode layer 111 in the reflective anode 1100 in the emission part E. In this case, the reflective electrode layer 111 may be a reflective electrode, which includes any one of APC (Ag:Pb:Cu), Ag, and Al, and the transparent electrode layer 112 may include any one of ITO, IZO, and ITZO.

The cathode 140 may include multiple layers. Among the layers of the cathode 140, the layer that is the most closely adjacent to the first and second emission units 130 and 130' may include an inorganic compound. For example, the cathode 140 may include an inorganic compound layer doped with LiF or Li so as to reduce an energy barrier when electrons are injected from the cathode 140 into the first and second emission units 130 and 130'. In this case, each of the layers of the cathode 140 may include metal.

The first emission unit 130 and the second emission unit 130' may include a first emission layer EML1 and a second emission layer EML2, respectively, and may be formed through the same stack-forming process.

The first emission layer EML1 and the second emission layer EML2 may be emission layers that emit lights having the same color as each other, or may be emission layers that emit lights having different colors from each other. As illustrated in FIG. 1, the first emission unit 130 may include a single layer, i.e. the first emission layer EML1, and the second emission unit 130' may include a single layer, i.e. the second emission layer EML2. However, the present invention is not limited thereto. The first and second emission units 130 and 130' may further include organic common layers, which are disposed under and on the first and second emission layers EML1 and EML2. In this case, the organic common layers may be formed on the substrate 100 without using a deposition mask. Alternatively, even when a deposition mask is used, the organic common layers may be formed on the substrate 100 using an open mask configuration, which is open to the entire active area AA. The organic common layers may be commonly provided in the emission part E and the transmission part T/E. Depending on the embodiment, in addition to the organic common layers, a transport layer may be selectively provided in a predetermined sub-pixel in the emission part E or in the transmission part T/E in order to adjust the optimal optical position of the emission layer emitting a corresponding colored light in each of the emission part E and the transmission part T/E. The transport layer, which is selectively provided in a predetermined sub-pixel in the emission part E or in the transmission part T/E, may be provided so as to contact the lower sides or the upper sides of the first and second emission layers EML1 and EML2, thereby adjusting the optimal position of the emission zone, which emits a corresponding colored light between the reflective anode 1100 and the cathode 140 or between the transparent anode 1200 and the cathode 140.

The first thin-film transistor TFT1 is electrically connected to the reflective anode 1100 via a first connecting portion CT1, and the second thin-film transistor TFT2 is electrically connected to the transparent anode 1200 via a second connecting portion CT2. The first and second connecting portions CT1 and CT2 are provided in the emission part E or under the bank layer 150 in order to increase the transmittance of the transmission part T/E. Here, a portion of the transparent anode 1200 may extend to the emission part E so as to overlap the second connecting portion CT2. In this case, the transparent anode 1200 and the reflective anode 1100 are spaced apart from each other so as to be electrically disconnected from each other.

Although not illustrated in the cross-sectional view, the bank layer 150 (refer to FIG. 3), which is formed in order to divide the emission part E or the transmission part T/E from adjacent parts, may be made of polyimide, polyamide, or photo acrylic. The bank layer 150 has a thickness of 1 μm or greater, thereby dividing the first emission unit 130 and the second emission unit 130', which are deposited in the emission part E and the transmission part T/E so as to be thin and flat, from each other. In the first and second emission units 130 and 130', the organic common layers, except for the emission layers EML1 and EML2 emitting different-colored lights, may be formed without using a deposition mask. The thickness of the organic common layer in at least a side portion of the bank layer 150 is smaller than the thickness of a flat portion of the emission part E or the transmission part T/E disposed between the bank layers 150.

In the embodiments to be described below, the emission layers EML1 and EML2 are configured as organic emission layers. However, the present invention is not limited thereto. The emission layer may be configured as an inorganic emission layer like a quantum dot, so long as efficiency and processability can be ensured to a predetermined level.

The first and second organic light-emitting diodes OLED1 and OLED2 may further include a capping layer, which is provided on the cathode 140 in order to improve the efficiency of extracting light upwards and to protect the organic light-emitting diodes.

As described above, the display device of the present invention includes the emission part E and the transmission part T/E provided on the transparent substrate 100, the first organic light-emitting diode OLED1 provided in the emission part E, and the second organic light-emitting diode OLED2 provided in the transmission part T/E. In addition, the display device of the present invention may further include an opposite transparent substrate 200, which is provided opposite the transparent substrate 100, a color filter layer 210, which selectively transmits a colored light emitted from the emission layer EML1 of each sub-pixel in the emission part E, and an encapsulation layer 300, which is provided between the transparent substrate 100 having the first and second organic light-emitting diodes OLED1 and OLED2 and the opposite transparent substrate 200 having the color filter layer 210.

Depending on the embodiment, the color filter layer 210 may not be located on the opposite transparent substrate 200, but may be located on the transparent substrate 100, specifically, under the reflective anode 1100 or on the cathode 140.

In order to secure the transparency of the transmission part T/E, the color filter layer 210 is not provided in the transmission part T/E.

Depending on the embodiment, the opposite transparent substrate 200 may be omitted. In this case, the color filter layer 210 may be located on the first organic light-emitting diode OLED1, and the encapsulation layer 300 may be formed so as to cover the first and second organic light-emitting diodes OLED1 and OLED2 and the color filter layer 210. In the case in which the color filter layer 210 is formed on the transparent substrate 100, the opposite transparent substrate 200 may be omitted. In the case in which the opposite transparent substrate 200 is omitted, a thin film, which is formed by alternately depositing inorganic layers and organic layers, may be further provided on the top surfaces of the first and second organic light-emitting diodes OLED1 and OLED2, i.e. on the capping layer.

The transparent substrate 100 and the opposite transparent substrate 200 may be formed of a transparent material that allows light to pass therethrough, for example, glass, plastic, or the like, and may also be formed so as to be flexible when the display device is mounted and used in vehicles or portable apparatuses. Preferably, a light-blocking film such as a polarizing sheet is not provided on any one of the transparent substrate 100 and the opposite transparent substrate 200 in order to secure the light-emitting and transmitting properties of the transmission part T/E.

According to the display device of the present invention, since the transmission part T/E is provided with the second organic light-emitting diode OLED2 configured to emit light like the emission part E, the transmission part T/E is capable of achieving transparent display without obstructing the field of vision of a driver and is also capable of performing auxiliary light emission in addition to light emission from the emission part E. Thus, it is possible to achieve display with brightness exceeding a predetermined level even when external natural light is reflected from the display device or even when a polarizing film is used to prevent such reflection of external natural light. As such, since the light-emitting display with brightness exceeding a predetermined level is achieved irrespective of external light, it is possible to stably and clearly display information to a user for a long time while maintaining transparency. In particular, since the display device of the present invention has improved light emission efficiency, it can be effectively used in a front window, a demountable head-up display device, a dashboard, a removable display, a side mirror, a room mirror, or the like of a car (a vehicle).

The above-described display device may be referred to as an active-type display device because the emission part E and the transmission part T/E can be selectively driven by the first thin-film transistor TFT1, which is electrically connected to the reflective anode 1100, and the second thin-film transistor TFT2, which is electrically connected to the transparent anode 1200.

In another embodiment, the first and second thin-film transistors TFT1 and TFT2 may be omitted from the configuration shown in FIG. 1, and the reflective anode 1100 and the transparent anode 1200 may be arranged in series in one direction so that the emission part E and the transmission part T/E may be integrally driven. This driving type is referred to as a passive type. The passive-type device operates such that the emission part E and the transmission part T/E emit light at the same time, but performs a limited information-displaying operation, e.g. simple lighting. The passive-type device is referred to as a (light-emitting) panel in that the first organic light-emitting diode OLED1 and the second organic light-emitting diode OLED2 are provided in the emission part E and the transmission part T/E, respectively, on the transparent substrate 100.

In this case, in order to divide the reflective anode 1100 of the emission part E and the transparent anode 1200 of the transmission part T/E from each other, the reflective anode 1100 of the emission part E may further include a reflective electrode 111, and the reflective anode 1100 of the emission part E and the transparent anode 1200 of the transmission part T/E may commonly include a transparent electrode 112.

In the display device of the present invention, the transmission parts T/E are divided into a plurality of sub-emission portions emitting different-colored lights, thereby being capable of emitting multiple-colored lights as well as a single-colored light. Thus, it is possible to improve the efficiency of emission of a corresponding colored light in response to a user's demand or the environment. Concrete examples thereof will be described below.

Hereinafter, the display devices according to the embodiments of the present invention will be described in detail with reference to plan views illustrating the arrangement of the pixels and cross-sectional views thereof.

First Embodiment

Figure 3:
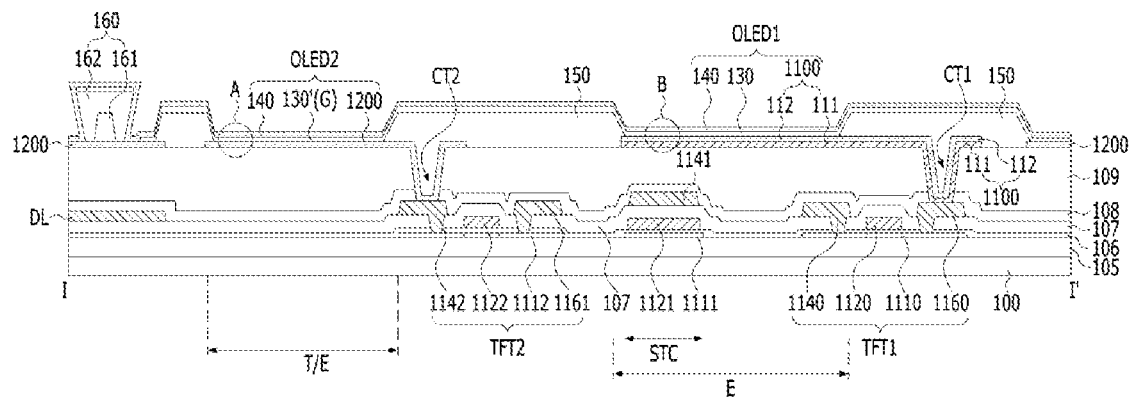
FIG. 3 is a cross-sectional view taken along line I-I' in FIG. 2.

FIG. 2 is a plan view of a display device according to a first embodiment of the present invention, and FIG. 3 is a cross-sectional view taken along line I-I' in FIG. 2.

One transmission part T/E and emission parts E provided around the same in the display device according to the first embodiment of the present invention will now be described with reference to FIG. 2.

As illustrated in FIGS. 2 and 3, the display device according to the first embodiment of the present invention includes first and second emission parts RE and BE, which are provided at the intersections between scan lines SL and data lines DL and emit two lights having different colors from each other, and a transmission part T/E provided between the first emission part RE and the second emission part BE.

In the display device according to the first embodiment of the present invention, first emission parts RE and second emission parts BE are alternately arranged in the same row and in the same column. The first emission part RE includes a red light emission layer and thus emits a red light, and the second emission part BE includes a blue light emission layer and thus emits a blue light. As such, since the emission parts emit lights having the longest wavelength and the shortest wavelength of the bands of visible light, the emission of light having an intermediate wavelength (i.e. a green wavelength) is insufficiently performed. Therefore, the transmission parts T/E may be arranged such that transmission parts G T/E, each including a green sub-emission layer G emitting a green light, are provided in a greater number than transmission parts including respective sub-emission layers emitting lights of other colors. However, in the display device according to the first embodiment of the present invention, none of the transmission parts T/E emit a single-colored light. In order to supplement light emission from the emission parts RE and BE, there are provided transmission parts T/E including a red sub-emission layer and a blue sub-emission layer, which are provided in the same layer as the red and blue emission layers of the emission parts RE and BE.

In the display device according to the first embodiment of the present invention, since the transmission part T/E includes the transparent anode 1200, the emitted light progresses both in the upward direction and in the downward direction, and thus the transmission part T/E has lower light emission efficiency per unit area than the emission part E (RE and BE). However, since the transmission part T/E is formed to be larger than the emission part E (RE and BE) and performs auxiliary light emission in addition to light emission from the emission part E, the display device according to the first embodiment of the present invention achieves high light emission efficiency, an excellent color gamut and low power consumption, compared to a display device in which only an emission layer is provided in an emission part.

Although the first and second emission parts RE and BE are illustrated as having a diamond shape, the present invention is not limited thereto. The first and second emission parts PE and BE may be formed in a circular shape, a rectangular shape, or a polygonal shape, in lieu of the shape described above. The first and second emission parts RE and BE emit light corresponding to the shape thereof.

As described above, since each of the first and second emission parts RE and BE is provided at a lower portion thereof with the reflective anode 1100, the light emission thereof is not affected by the thin-film transistors TFT1 and TFT2 provided under the reflective anode 1100.

In order to improve the transparency of the display device, it is desirable that the transmission part T/E be formed to have a larger area than each of the emission parts RE and BE. Further, the total area of the transmission parts T/E included in the transparent substrate 100 may be larger than the total area of the emission parts E.

Although the transmission part T/E is illustrated as having a hexagonal shape, the present invention is not limited thereto. The transmission part T/E may be formed in a circular shape or a polygonal shape, rather than the hexagonal shape. In order to ensure the transparency of the transmission part T/E, the transmission part T/E is disposed so as not to overlap the emission parts RE and BE, each of which includes the lines SL and DL, the thin-film transistors TFT1 and TFT2 and the reflective anode 1100.

A bank layer 150 may be formed in a region other than the emission parts E and the transmission parts T/E in order to shield the light-blocking elements such as, for example, lines and to divide adjacent pixels or adjacent sub-pixels from each other.

Further, in order to ensure the transparency of the transmission part T/E, it is desirable that the second thin-film transistor TFT2, which is provided to drive the second organic light-emitting diode OLED2 included in the transmission part T/E, be provided in the emission parts RE and BE or under the bank layer 150 (refer to FIG. 3).

Here, a region may or may not be present between the emission part E and the transmission part T/E. In the case in which no region is present between the emission part E and the transmission part T/E, the emission part E is disposed to cover the lines SL and DL so that the lines located under the first organic light-emitting diode OLED1 of the emission part E are invisible.

The display device of the present invention emits different-colored lights. Specifically, the display device emits a red light, which has a wavelength of 600 nm to 650 nm, a blue light, which has a wavelength of 430 nm to 490 nm, and a green light, which has a wavelength of 510 nm to 590 nm.

An emission part E, which includes the first emission part RE and the second emission part BE, which are disposed adjacent to each other, and two transmission parts T/E, which are disposed adjacent to each of the first and second emission parts RE and BE, may form a pixel. A plurality of pixels may be arranged in a plurality of rows and columns on the transparent substrate 100. The emission part and the transmission part T/E function as sub-pixels, which are connected with the first thin-film transistor TFT1 and the second thin-film transistor TFT2, respectively, and are driven independently.

The first emission parts RE and the second emission parts BE, which emit different-colored lights from each other, are arranged such that the first emission parts RE are arranged in a first diagonal direction, specifically, at the left-upper side of the transmission part T/E and the right-lower side thereof and such that the second emission parts BE are arranged in a second diagonal direction, specifically, at the right-upper side of the transmission part T/E and the left-lower side thereof. The emission parts E (RE and BE) may be located at positions corresponding to the intersections between the scan lines S and the data lines DL, and the transmission parts T/E may be located so as to be spaced apart from the emission parts E and so as not to overlap either of the scan lines SL and the data lines DL.

As illustrated in FIG. 3, the first thin-film transistor TFT1 of each of the emission parts E (RE and BE) includes a first gate electrode 1120, which is formed in the same layer as the scan lines SL, a first semiconductor layer 1110, a channel region which overlaps the first gate electrode 1120, and a first source electrode 1140 and a first drain electrode 1160, which are connected to both sides of the first semiconductor layer 1110. The first gate electrode 1120 may be integrally formed with the scan lines SL in a pattern such that the same protrudes from the scan lines SL. The first source electrode 1140 may be formed in a pattern such that the same protrudes from the data lines DL. The first drain electrode 1160 is formed so as to be spaced apart from the first source electrode 1140, and is connected to the reflective anode 1100 of the first organic light-emitting diode OLED1 via the first connecting portion CT1.

The second thin-film transistor TFT2 may be formed in the same process as the first thin-film transistor TFT1. Thus, the second thin-film transistor TFT2 includes a second gate electrode 1122, which is formed in the same layer as the scan lines SL, a second semiconductor layer 1112, a channel region which overlaps the second gate electrode 1122, and a second source electrode 1161 and a second drain electrode 1142, which are connected to both sides of the second semiconductor layer 1112. The second gate electrode 1122 may be integrally formed with the scan lines SL in a pattern such that the same protrudes from the scan lines SL. Alternatively, additional scan lines (ASL, not illustrated) may be provided, and the second gate electrode 1122 may be formed so as to protrude from the additional scan lines ASL. In the case in which the second gate electrode 1122 is formed so as to protrude from the additional scan lines ASL or is connected thereto, the second thin-film transistor TFT2 may be driven at a different time point from the first thin-film transistor TFT1. The second source electrode 1161 may be formed in a pattern such that the same protrudes from the data lines DL. In this case, the data lines DL to which the second source electrode 1161 is connected may be different from the data lines DL to which the first thin-film transistor TFT1 is connected. The second drain electrode 1142 is formed so as to be spaced apart from the data lines DL and the second source electrode 1161, and is connected to the transparent anode 1200 of the second organic light-emitting diode OLED2 via the second connecting portion CT2.

Hereinafter, the layered structure of the display device will be described in detail with reference to FIG. 3.

A buffer layer 105 is provided on the transparent substrate 100, and first, second and third semiconductor layers 1110, 1112 and 1111 are provided on the buffer layer 105. The buffer layer 105 serves to prevent impurities, which remain in the transparent substrate 100, from being introduced into the semiconductor layers 1110, 1112 and 1111. The semiconductor layers 1110, 1111 and 1112 may be amorphous or crystalline silicon semiconductor layers, or may be transparent oxide semiconductor layers. Both sides of the first and second semiconductor layers 1110 and 1112, to which the first and second source electrodes 1140 and 1161 and the first and second drain electrodes 1160 and 1142 are connected, may be regions into which impurities have been injected. An intrinsic region of each of the first and second semiconductor layers 1110 and 1112, which is formed between the impurity-injected regions thereof, may function as a channel region.

The third semiconductor layer 1111 may be located so as to overlap storage electrodes 1121 and 1141, which are to be formed thereon, and may be used as an auxiliary storage electrode for increasing the capacity of the storage capacitor when impurities have been injected. Alternatively, depending on the embodiment, the third semiconductor layer 1111 may be omitted.

A gate insulation film 106 is provided to cover the first to third semiconductor layers 1110, 1112 and 1111, and first and second gate electrodes 1120 and 1122 and the first storage electrode 1121 are formed so as to overlap the intrinsic regions of the first and second semiconductor layers 1110 and 1112 and the third semiconductor layer 1111.

A first interlayer insulation film 107 is provided so as to cover the first, second and third semiconductor layers 1110, 1112 and 1111, the first and second gate electrodes 1120 and 1122 and the first storage electrode 1121.

Contact holes CT1, CT2 are formed by selectively removing portions of the first interlayer insulation film 107 and the gate insulation film 106. The first source electrode 1140 and the first drain electrode 1160 are connected to both sides of the first semiconductor layer 1110 through the contact holes CT1, and the second source electrode 1161 and the second drain electrode 1142 are connected to both sides of the second semiconductor layer 1112 through the contact holes CT2. In the same process, a second storage electrode 1141 is formed on the first interlayer insulation film 107, which overlaps the first storage electrode 1121.

The first thin-film transistor TFT1 for driving the first organic light-emitting diode OLED1 of the emission part E (RE and BE) includes the first semiconductor layer 1110, the first gate electrode 1120, a channel region which overlaps the first semiconductor layer 1110, and the first source electrode 1140 and the first drain electrode 1160 connected to both sides of the first semiconductor layer 1110, which are sequentially arranged from the bottom of the first thin-film transistor TFT1. The second thin-film transistor TFT2 for driving the second organic light-emitting diode OLED2 of the transmission part T/E does not overlap the transmission part T/E, and has the same layered structure as the first thin-film transistor TFT1. The second thin-film transistor TFT2 includes the second semiconductor layer 1112, the second gate electrode 1122, a channel region which overlaps the second semiconductor layer 1112, and the second source electrode 1161 and the second drain electrode 1142 connected to both sides of the second semiconductor layer 1112, which are sequentially arranged from the bottom of the second thin-film transistor TFT2.

The storage capacitor STC includes the first storage electrode 1121 and the second storage electrode 1141, which overlap each other with the first interlayer insulation film 170 interposed therebetween.

A second interlayer insulation film 108 is formed so as to cover the first and second thin-film transistors TFT1 and TFT2 and the storage capacitor STC.

The first and second thin-film transistors TFT1 and TFT2 and the storage capacitor STC include light-blocking metal layers. The first and second thin-film transistors TFT1 and TFT2 and the storage capacitor STC may be arranged so as not to overlap the transmission part T/E, and may thus be arranged so as to overlap the emission part E (RE and BE) or the bank layer 150. The bank layer 150 may be located between the transmission part T/E and the emission part E, or may be located between the red light-emitting region RE and the blue light-emitting region BE of the emission part E, which are spaced apart from each other. In the emission part E, the reflective anode 1100 may prevent the metal layers, which are disposed under the same, from being visible. The bank layer 150, which is relatively thick, may prevent the configuration under the same from being visible.

In addition, a planarization film 109 is formed so as to cover the first interlayer insulation film 108 to planarize the surface thereof. The first and second connecting portions CT1 and CT2 are formed by selectively removing portions of the planarization film 109 and the second interlayer insulation film 108. Thus, the first and second thin-film transistors TFT1 and TFT2 may be connected to the reflective anode 1100 and the transparent anode 1200 via the first and second connecting portions CT1 and CT2, respectively.

In the display device of the present invention, a partition wall 160 is provided in a region in which the transmission part T/E and the emission part E are not located in order to divide the adjacent transmission parts T/E or the adjacent emission parts E from each other. The partition wall 160 prevents a deposition mask (not illustrated), which is used for deposition of an organic material, from directly contacting the bank layer 150 when the emission units 130 and 130' (G) are formed, thereby causing the bank layer 150 for dividing regions to maintain the shape thereof without collapsing.

The partition wall 160 includes a first layer 161, which is formed in the same layer as the bank layer 150, and a second layer 162, which covers the first layer 161 and has a predetermined height from the top surface of the first layer 161. The second layer 162 may be formed in the same layer as a spacer (not illustrated) formed on the bank layer in order to prevent a deposition mask, which is used for the formation of the organic common layer or the emission layer, from directly contacting the bank layer 150 or drooping after the formation of the bank layer 150.

Hereinafter, embodiments, which are varied depending on the layered structures of the first organic light-emitting diode OLED1 and the second organic light-emitting diode OLED2, will be described. In each embodiment, the transmission part T/E has an electrode structure in which the transparent anode 1200 and the cathode 140 are disposed opposite each other, and the emission part E has an electrode structure in which the reflective anode 1100 and the cathode 140 are disposed opposite each other. Although the reflective anode 1100 is illustrated as having a two-layered structure that includes a reflective electrode layer 111 and a transparent electrode layer 112, the present invention is not limited thereto. The transparent electrode layer 112 may be omitted, or each of the transparent electrode layer 112 and the reflective electrode layer 111 may be formed to have a multi-layered structure. In the case in which the reflective anode 1100 includes the transparent electrode layer 112, the transparent anode 1200 of the transmission part T/E may be formed in the same process as the transparent electrode layer 112. Depending on the embodiment, the transparent electrode layer may be provided under the reflective electrode layer 111 as well as on the reflective electrode layer 111. In this case, the transparent anode 1200 may include transparent electrode layers having a two-layered structure.

Hereinafter, various embodiments, in which the configurations of the first and second emission units 130 and 130' (G) are varied, will be described.

In the display device of the present invention, since the transmission part T/E performs light emission and transmission at the same time, the configurations of the anode and the emission units 130 and 130' (G) thereof are different from those of the emission part E. It has been described above that the emission part includes the reflective anode and that the transmission part includes the transparent anode. Hereinafter, various embodiments will be described with reference to the difference in the configurations of the emission units 130 and 130'.

Figure 4A:
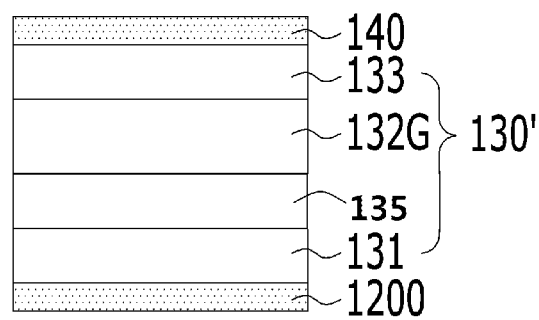
FIGS. 4A and 4B are cross-sectional views of region A and region B, respectively, in FIG. 3.
Figure 4B:
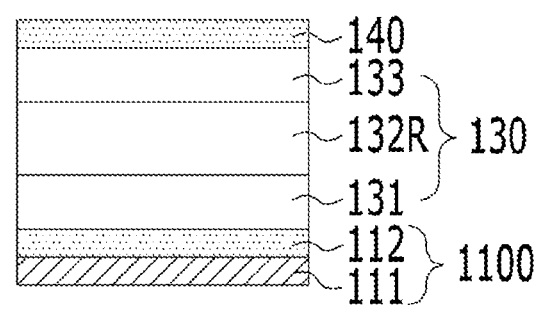

FIGS. 4A and 4B are cross-sectional views of region A and region B, respectively, in FIG. 3.

As illustrated in FIG. 4B, in the display device according to the first embodiment of the present invention, the first emission unit 130 of the emission part E has a structure in which a first organic common layer 131, a first emission layer 132R and a second organic common layer 133 are stacked on one another. The first organic common layer 131 may be provided with layers associated with hole transport, which may include a hole injection layer, a hole transport layer and an electron-blocking layer. The second organic common layer 133 may be provided with layers associated with electron transport, which may include a hole-blocking layer, an electron transport layer and an auxiliary cathode layer.

As illustrated in FIG. 2, the first emission layer includes a red light emission layer 132R, which is provided in the red light emission part RE, or a blue light emission layer, which is provided in the blue light emission part BE.

As illustrated in FIG. 4A, the second emission unit 130' of the transmission part T/E includes all of the elements of the first emission unit 130 of the emission part E, and further includes an OCL (optical compensation layer) 135. That is, the second emission unit 130' includes the first organic common layer 131, a sub-emission layer 132G, which is separate from the first emission layer 132R, and the second organic common layer 133. Here, the sub-emission layer in the second emission unit 130' includes a green sub-emission layer 132G, which is located in the transmission part T/E G, a blue sub-emission layer, which is located in the transmission part T/E B, or a red sub-emission layer, which is located in the transmission part T/E R.

Unlike the emission part E including the reflective anode 1100, the second organic light-emitting diode OLED2 of the transmission part T/E includes the transparent anode 1200. Thus, the Fabry-Perot effect, which is a reflection interference phenomenon occurring between the reflective anode 1100 and the cathode 140 in the first organic light-emitting diode OLED1, occurs in a different way from that in the second organic light-emitting diode OLED2 due to differences of reflection, and the optical compensation layer 135 is provided to compensate for the difference in optical resonance effects between the two regions. That is, because the reflection interference phenomenon occurring between the transparent anode 1200 and the transmissive or reflective-transmissive cathode 140, which are disposed opposite each other, in the second organic light-emitting diode OLED2 of the transmission part T/E acts in a different way from that in the first organic light-emitting diode OLED1, the optical compensation layer 135 is further provided to adjust the vertical position of the sub-emission layer 132G so that light is optimally emitted through the cathode 140 when the transmission part T/E is used for light emission. In this case, the optical compensation layer 135 is disposed so as to be in contact with the top surface or the bottom surface of the sub-emission layer 132G. In the case in which the optical compensation layer 135 is located under the sub-emission layer 132G, it is effective for adjustment of the position of the sub-emission layer 132G between the transparent anode 1100 and the cathode 140. When the optical compensation layer 135 has a thickness of about 400 Å to about 1200 Å, the transmission part T/E exhibits optimal emission efficiency. More preferably, the thickness of the optical compensation layer 135 may range from 700 Å to 900 Å. Since the transmission part T/E further includes the optical compensation layer 135 compared to the emission part E, the second emission unit 130' is thicker than the first emission unit 130 of the emission part E.

The blue light emission layer provided in the emission part E may have the same host and the same dopant as the blue sub-emission layer located in the transmission part T/E B, and the red light emission layer provided in the emission part E may have the same host and the same dopant as the red sub-emission layer located in the transmission part T/E R. The reason for this is to form an emission layer and a sub-emission layer that emit the same-colored light as each other in the same process. Depending on the embodiment, the emission layer and the sub-emission layer may be formed of different materials (hosts and dopants) from each other. This is for securing the optimal emission efficiency and the optimal transparency of the emission part and the transmission part.

As described above, in the first embodiment, each of the first and second emission units 130 and 130' has a single vertical organic stack structure that includes a single emission layer.

Hereinafter, a modified example, which includes multiple stacks, each of which includes an emission layer, will be described.

Modified Example of First Embodiment

Figure 5A:
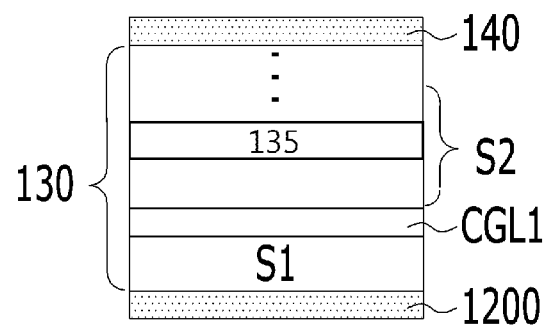
FIGS. 5A and 5B are cross-sectional views of region A and region B, respectively, in FIG. 3 with respect to a modified example of the display device according to the first embodiment of the present invention.
Figure 5B:
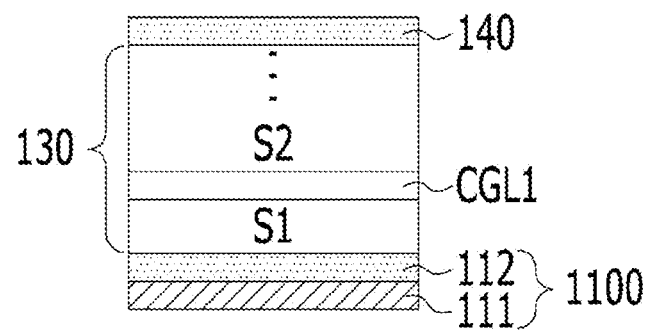

FIGS. 5A and 5B are cross-sectional views of region A and region B, respectively, in FIG. 3 with respect to a modified example of the display device according to the first embodiment of the present invention.

As illustrated in FIGS. 5A and 5B, in a modified example of the display device according to the first embodiment of the present invention, each of the first and second emission units 130 and 130' includes two or more stacks (S1, S2, . . . ). However, as illustrated in FIG. 5A, an optical compensation layer 135 is further provided in at least one stack (S1 or S2, . . . ) so as to be in contact with the emission layer 132G in the second organic stack 130'. Optical compensation layers 135 may be provided so as to be in contact with all of the emission layers provided in the first and second organic stacks 130 and 130'. Alternatively, an optical compensation layer 135 may be provided so as to be in contact with the emission layer in any one stack (S1 or S2, . . . ). Alternatively, in the case in which three or more stacks are provided, optical compensation layers 135 may be provided so as to be in contact with the emission layers in two or more stacks. In any case, it is desirable that the total thickness of the optical compensation layers 135 in the whole organic stack be in the range of 400 Å to 1200 Å.

The optical compensation layer 135 may be formed of the same material as any one of the organic layers provided in the first and second organic stacks, or may include a different material from the organic layers provided in the first and second organic stacks. Depending on the embodiment, the optical compensation layer 135 may include an inorganic material unless it obstructs the extraction of light from the transmission part T/E and the emission part E.

Depending on the embodiment, in the case in which the first and second emission units 130 and 130' are provided as multiple stacks, the optical compensation layers 135 may be located on the emission layers EML as well as under the emission layers EML. In the case in which the optical compensation layers are located in some of the multiple stacks, an optical compensation layer may be located under the emission layer in any one stack, and another optical compensation layer may be located on the emission layer in another stack. Thus, it is possible to adjust the position of the emission layer (EML1, EML2, . . . , EMLn) in each stack between the transparent anode 1200 and the cathode 140.

Depending on the embodiment, except for the first organic common layer 131 and the second organic common layer 133, in order to adjust the positions of the emission layers 132R and 132G within the organic stacks 130 and 130' so as to have optimal emission efficiency, a hole transport layer (not illustrated) may be further provided adjacent to the emission layers 132R and 132G in a certain sub-pixel of the emission part E or in the transmission part T/E.

In order to adjust the vertical position of the emission region for each color between the reflective anode 1100 and the cathode 140 in each of the emission parts E, the thicknesses of the emission layers 132R and 132B in the emission parts E, which emit different-colored lights from each other, may be different.

The red sub-emission layer and the blue sub-emission layer of the transmission parts T/E, which are formed in the same process as the emission layers 132R and 132B of the emission parts E, may have the same thickness as the emission layers of the emission parts E. The green sub-emission layer 132G, which is separately provided in the transmission part T/E, may have a different thickness from the red and blue light emission layers 132R and 132B.

The emission layers provided in the emission parts E are not limited to the red and blue light emission layers shown in FIG. 2, but may be substituted with emission layers emitting other colored lights, e.g. a magenta light emission layer and a cyan light emission layer. In this case, the green sub-emission layer provided in the transmission part T/E may be substituted with a sub-yellow light emission layer. Further, like the emission parts E, the red sub-emission layer and the sub-blue emission layer may be substituted with a sub-magenta light emission layer and a sub-cyan light emission layer.

Depending on the embodiment, in addition to the two-color combination shown in FIG. 2, the emission parts E may further include an emission layer emitting another-colored light and thus may have a three-color combination. A detailed description thereof will be made with reference to embodiments to be described later.

Although the transmission part T/E is illustrated as having a three-color combination, it may be configured to have a combination of at least two colors in order to prolong the lifespan of the emission layers provided in the emission parts.

In the embodiment shown in FIG. 2, in order to supplement the emission of green light, which is not emitted from the emission parts RE and BE, the transmission parts T/E are formed such that the area of the green sub-emission layer is greater than the area of other emission layers. However, in the case in which the emission parts include a green light emission layer, the ratio of areas of the emission layers provided in the transmission parts T/E may be varied such that the area of other emission layers is greater than the area of the green sub-emission layer.

In the case in which the display device is attached to the front glass of a vehicle, because an optical film for blocking external light is adhered to the rear surface of the front glass, the front glass may not be uniformly transparent to visible light in the entire wavelength range, but may restrict the radiation of light within a specific wavelength range. According to the display device of the present invention, an emission layer corresponding to light having a wavelength range that is blocked by the optical film adhered to the front glass is formed with a relatively large area in the transmission parts T/E, thereby compensating for the insufficient amount of light that is radiated.

Depending on the embodiment, a sub-emission layer emitting a light having a specific color may be disposed with a relatively large area or a relatively small area in the transmission parts in response to the demand of a customer. In the latter case, when sub-emission layers emitting lights having three colors are disposed in the transmission parts, each of the sub-emission layers emitting lights having two colors may be disposed with a larger area than the sub-emission layer emitting the one remaining color.

In the case of a completely transparent front glass, to which no optical film blocking light within a specific wavelength range is adhered, it may be effective from the aspect of light emission efficiency to dispose the green sub-emission layer 132G, which is the most visible, in the largest area in the transmission parts T/E. However, the display device of the present invention is not limited thereto. If a certain color is preferred in an application using the display device, the sub-emission layer, which is disposed with the largest area in the transmission parts T/E, may be substituted with a sub-emission layer emitting a light having a color other than green.

Hereinafter, second to fifth embodiments, in which the planar arrangement of the emission layers and the sub-emission layers of the transmission parts and the emission parts are varied, will be described with reference to the drawings.

FIGS. 6 to 9 are plan views of display devices according to second to fifth embodiments, respectively, of the present invention.

Second Embodiment

Figure 6:
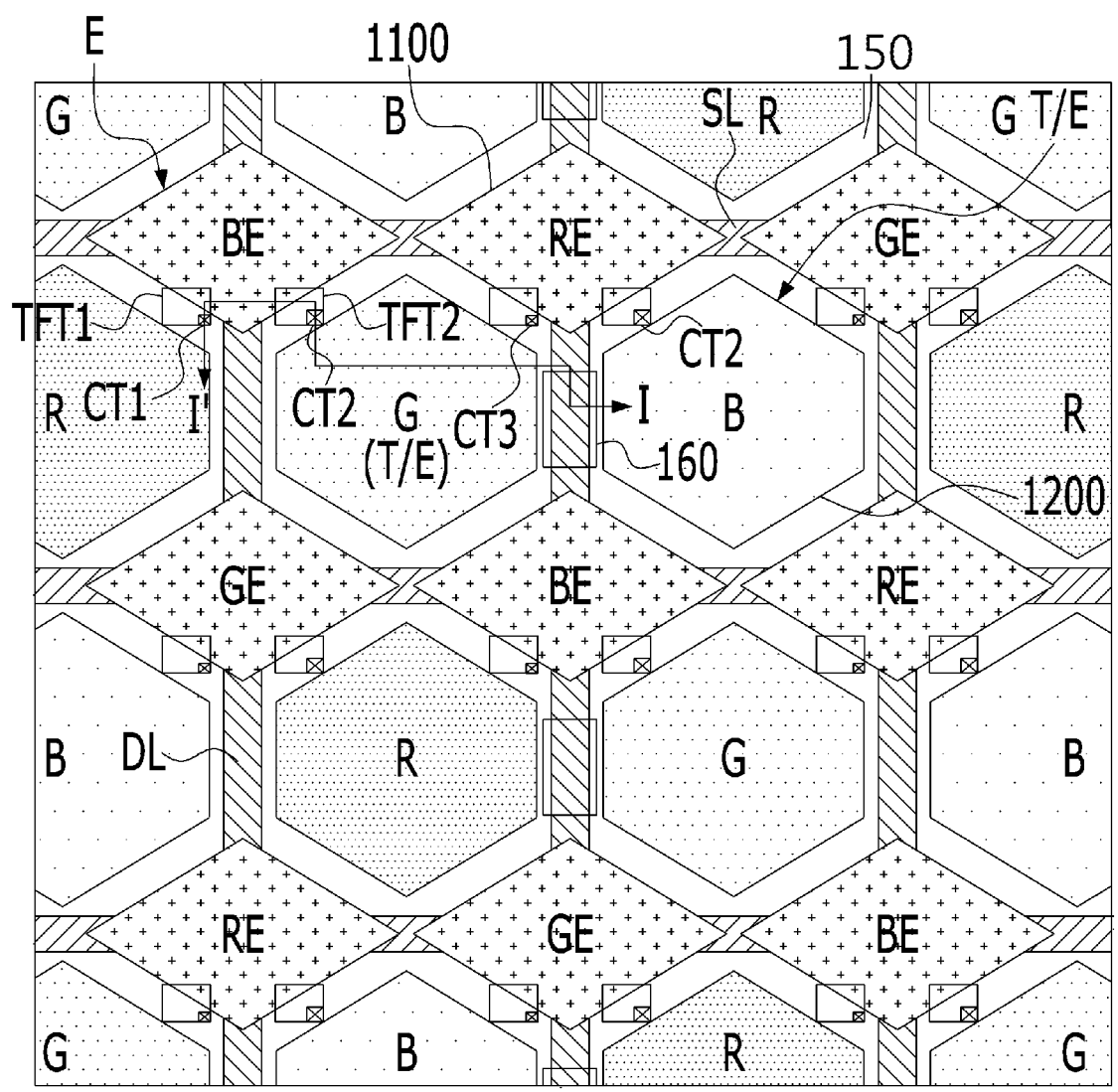
FIGS. 6 to 9 are plan views of display devices according to second to fifth embodiments, respectively, of the present invention.

As illustrated in FIG. 6, in the display device according to the second embodiment of the present invention, the emission parts RE, GE and BE and the transmission parts R, G and B are arranged such that the red, green and blue emission layers and the red, green and blue sub-emission layers are sequentially arranged in rows or columns.

That is, the red, green and blue emission layers and the red, green and blue sub-emission layers are evenly disposed in the emission parts and the transmission parts. In the display device according to the second embodiment of the present invention, the sub-emission layer of the transmission part, which emits a light having the same color as the emission layer of the emission part, is used for auxiliary light emission. That is, the transmission part performs auxiliary light emission in addition to light emission from the emission part, thereby increasing the lifespan of the first organic light-emitting diode OLED1 (refer to FIG. 3) in the emission part.

Unlike the emission part including the reflective anode 1100 (refer to FIG. 3), the transmission part including the transparent anode 1200 (refer to FIG. 3), as illustrated in FIGS. 4A and 5A, may further include an optical compensation layer, which is in contact with the emission layer, in order to compensate for the difference in fine resonance between the anode and the cathode depending on the application of the reflective anode. The optical compensation layer may be formed of the same material as at least any one of the layers provided in the emission unit, or may be formed of a different material therefrom. Considering that the optical compensation layer is in contact with the emission layer, if the optical compensation layer is formed of the same material as a transport material formed on the front or rear side of the emission layer, the use of a deposition mask may be reduced.

In this case, since the transmission part further includes the optical compensation layer, the thickness of the emission unit, which is formed of an organic material on the anode and cathode, is greater than the thickness of the emission unit of the emission part.

The emission part has a top-emission-type structure so that light is optimally extracted toward an observer. However, the light emitted from the transmission part progresses both in the upward direction and in the downward direction in order to maintain the transparency of the transmission part, thus causing the loss of light. Thus, when the respective emission layers of the emission part and the respective sub-emission layers of the transmission part are formed of the same material (host and dopant) as each other, the full width at half maximum (FWHM) of the transmission part is greater than the FWHM of the emission part. This means that the color purity of the transmission part is lowered when the emission layers and the sub-emission layers are formed of the same material as each other. However, since the transmission part is used not only for emission, but also needs to maintain transparency at a predetermined level, the function of the transmission part is to perform auxiliary light emission in addition to light emission from the emission part. Thus, the color purity of the light emitted from the entire display device is not determined by the color purity of the light emitted from the transmission part, but is determined by the color purity of the light emitted from the emission part.

Similar to the first embodiment described above, the transmission part and the emission part include the transparent anode 1200, the reflective anode 1100, the second emission unit 130' provided on the transparent anode 1200, the first emission unit 130 provided on the reflective anode 1100, the sub-emission layer provided in the second emission unit 130', and the emission layer provided in the first emission unit 130.

Third Embodiment

Figure 7:
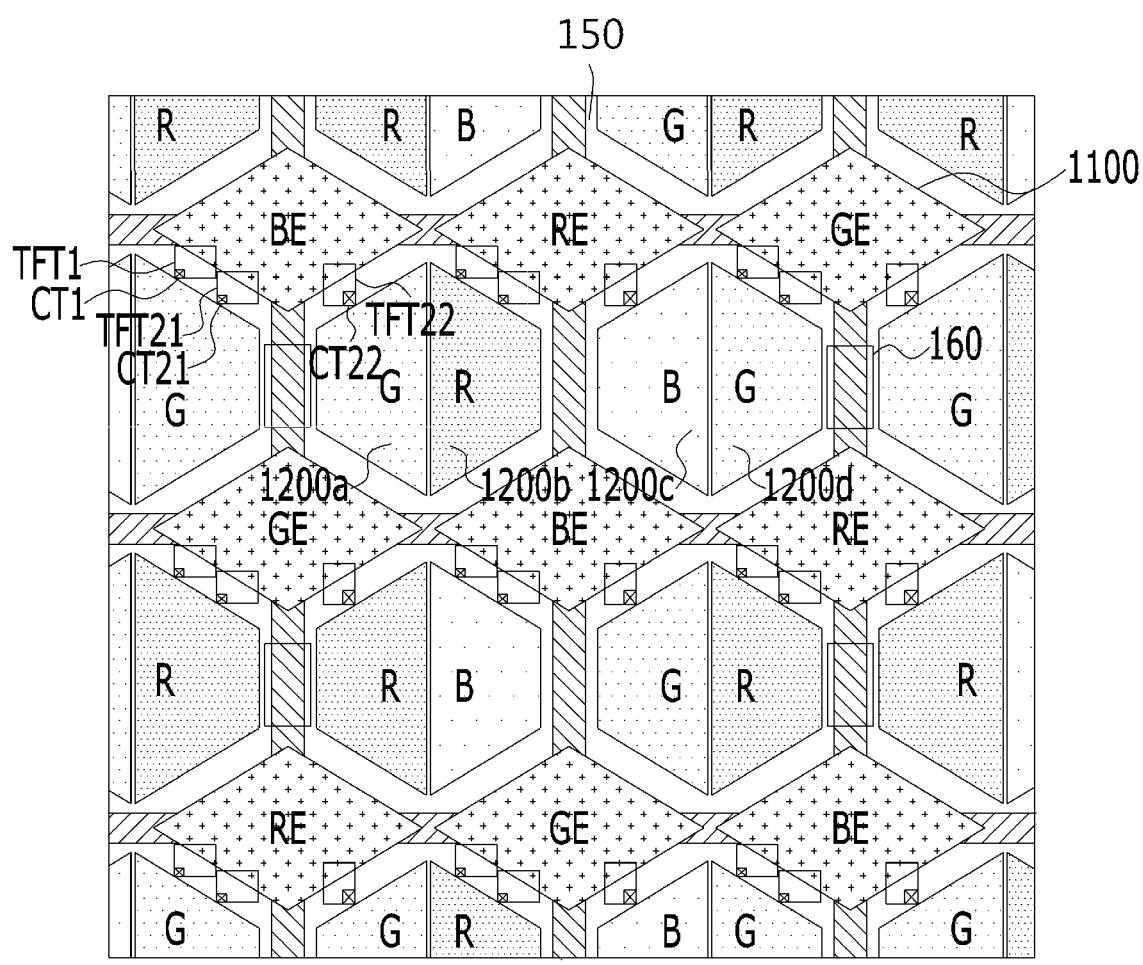

As illustrated in FIG. 7, the display device according to the third embodiment of the present invention is configured such that transmission parts G/R, B/G or R/B, divided into two, rather than a single transmission part, are disposed between adjacent emission parts (BE and RE, RE and GE, or GE and RE). In addition to a first thin-film transistor TFT1 for driving each emission part, second thin-film transistors TFT21 and TFT22 for driving the transmission parts divided into two are provided in the emission part BE, RE or GE or under a bank layer 150 (refer to FIG. 3) formed between the emission part and the transmission part. The reflective anode 1100 of the emission part may protrude toward the bank layer so as to overlap the first thin-film transistor TFT1, and may be electrically connected to the first thin-film transistor TFT1 via a first contact hole CT1. The transparent anodes 1200*a*, 1200*b*, 1200*c* and 1200*d* of the transmission parts may protrude toward the bank layer so as to overlap the second thin-film transistors TFT21 and TFT22, and may be connected to the second thin-film transistors TFT21 and TFT22 via second contact holes CT21 and CT22, respectively.

In the display device of the third embodiment, the sub-emission layers of the transmission parts divided into two (1200*a* and 1200*b*, or 1200*c* and 1200*d*) are arranged such that the ratio of the red and green sub-emission layers to the blue sub-emission layer is 3:2. That is, the red and green colors are emphasized to compensate for the light emission efficiency. However, the present invention is not limited thereto. The sub-emission layers of the transmission parts, which emit lights having three different colors from each other, may be arranged such that a color other than red and green is emphasized.

Here, the cross-sectional configurations of the transmission part and the emission part are the same as illustrated in FIG. 3, and a description thereof will be omitted.

Fourth Embodiment

Figure 8:
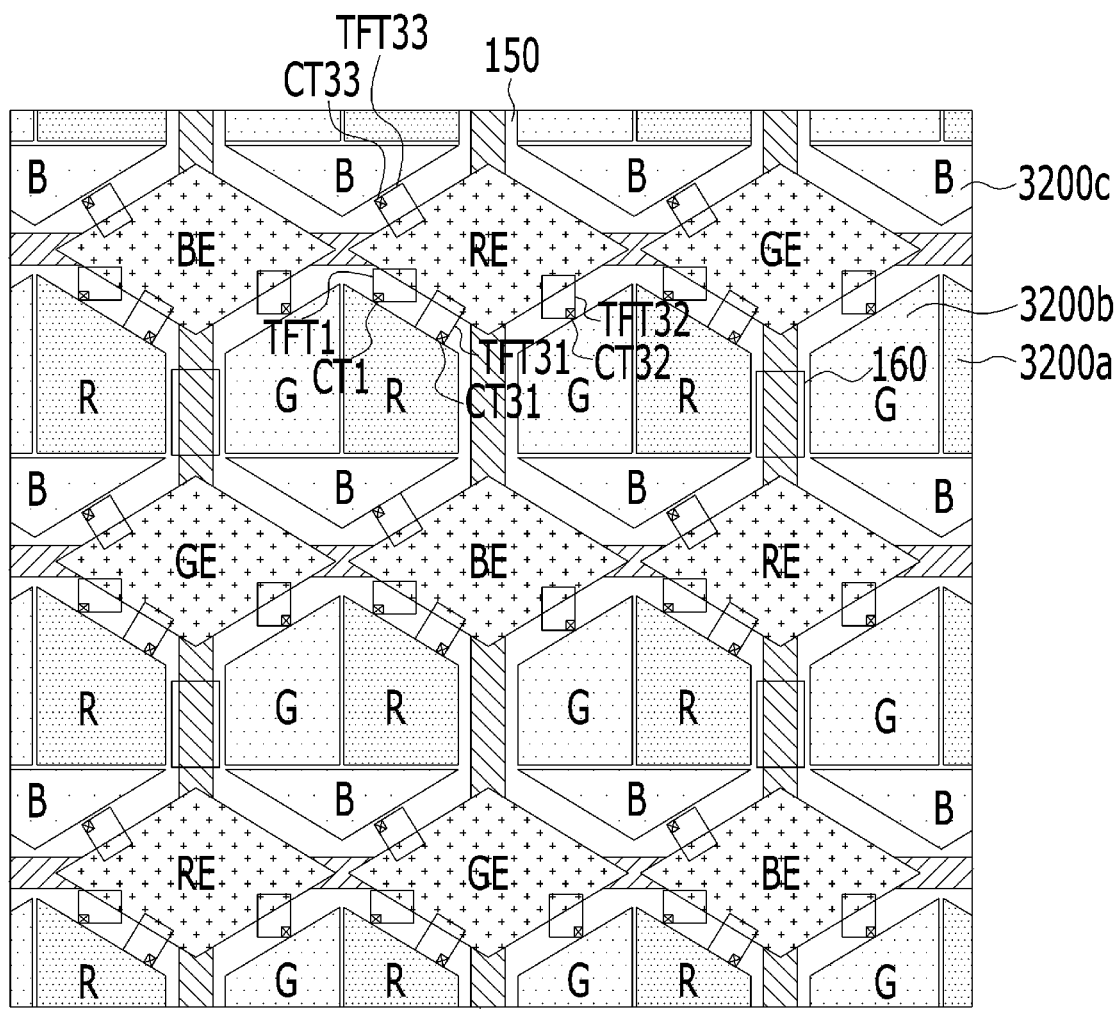

As illustrated in FIG. 8, the display device according to the fourth embodiment of the present invention is configured such that transmission parts R, G and B, divided into three, rather than a single transmission part, are disposed between adjacent emission parts (BE and RE, RE and GE, or GE and RE). In addition to a first thin-film transistor TFT1 for driving each emission part, second thin-film transistors TFT31, TFT32 and TFT33 for driving the transmission parts divided into three are provided in the emission part BE, RE or GE or under a bank layer 150 (refer to FIG. 3) formed between the emission part and the transmission part. The reflective anode 1100 of the emission part may protrude toward the bank layer (between the transmission part and the emission part) so as to overlap the first thin-film transistor TFT1, and may be electrically connected to the first thin-film transistor TFT1 via a first contact hole CT1. The transparent anodes 3200*a*, 3200*b* and 3200*c* of the transmission parts may protrude toward the bank layer so as to overlap the second thin-film transistors TFT31, TFT32 and TFT33, and may be connected to the second thin-film transistors TFT31, TFT32 and TFT33 via second contact holes CT31, CT32 and CT33, respectively.

In the display device of the fourth embodiment, the sub-emission layers of the transmission parts are arranged such that the sub-emission layer R, the sub-emission layer G and the sub-emission layer B are evenly arranged between the adjacent emission parts.

Due to this arrangement, the transmission part compensates for the light emission efficiency evenly with respect to the red, green and blue colors. The arrangement for emitting red, green and blue light may be substituted with the arrangement for emitting magenta, cyan and yellow lights. However, the present invention is not limited thereto. Sub-emission layers emitting lights having other colors may be combined so as to realize a white light.

Fifth Embodiment

Figure 9:
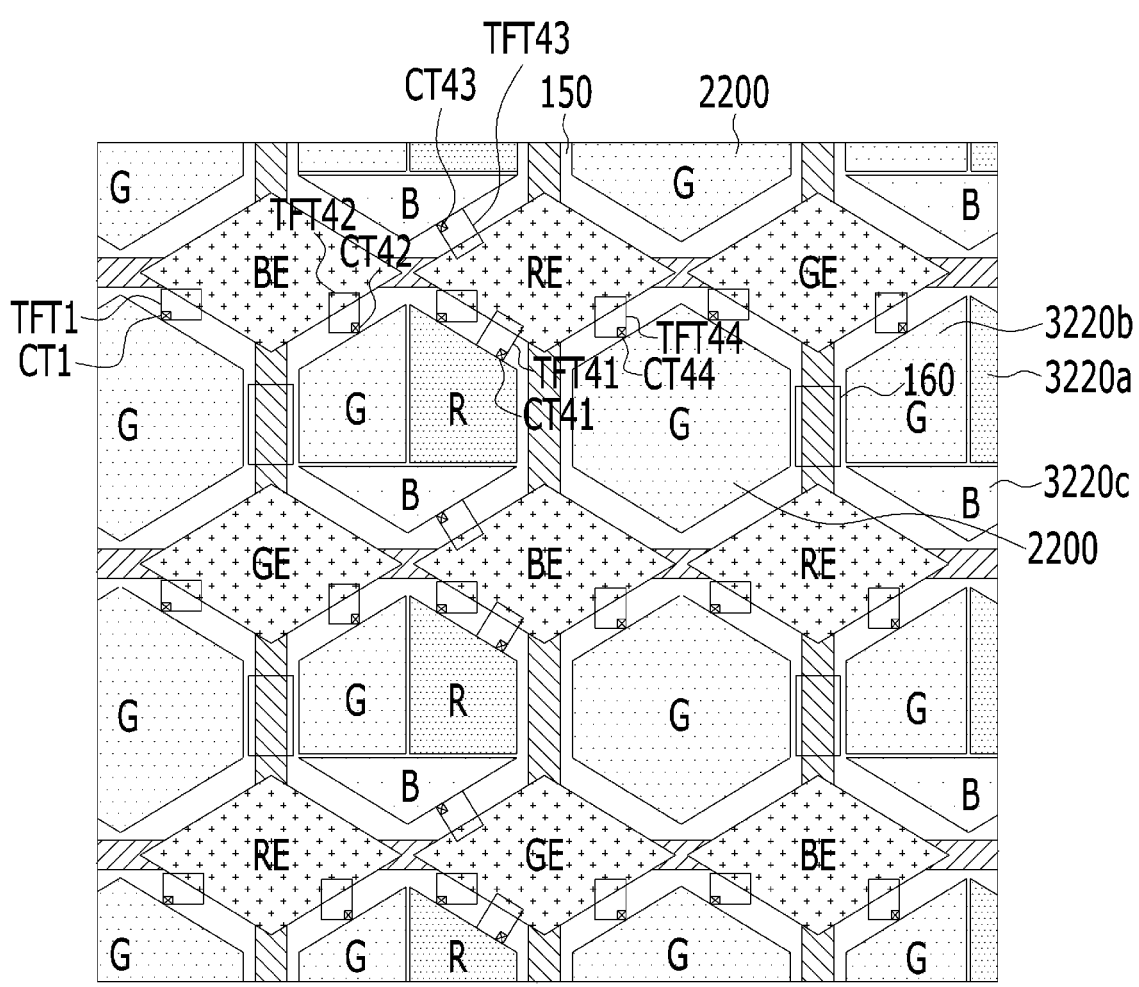

As illustrated in FIG. 9, the display device according to the fifth embodiment of the present invention is configured such that transmission parts R, G and B divided into three and a single transmission part G including a green sub-emission layer are alternately disposed between adjacent emission parts (BE and RE, RE and GE, or GE and RE). In addition to a first thin-film transistor TFT1 for driving each emission part, second thin-film transistors TFT31, TFT32 and TFT33 for driving the transmission parts divided into three and a third thin-film transistor TFT44 for driving the single transmission part are provided in the emission part BE, RE or GE or under a bank layer 150 (refer to FIG. 3) formed between the emission part and the transmission part. The reflective anode 1100 of the emission part may protrude toward the bank layer (between the transmission part and the emission part) so as to overlap the first thin-film transistor TFT1, and may be electrically connected to the first thin-film transistor TFT1 via a first contact hole CT1. The transparent anodes 3220*a*, 3220*b*, 3220*c* and 2200 of the transmission parts may protrude toward the bank layer so as to overlap the second thin-film transistors TFT41, TFT42 and TFT43 and the third thin-film transistor TFT44, and may be connected to the second thin-film transistors TFT41, TFT42 and TFT43 and the third thin-film transistor TFT 44 via second contact holes CT41, CT42 and CT43 and a third contact hole CT44, respectively.

In the display device of the fifth embodiment, the sub-emission layers of the transmission parts are arranged such that a single green sub-emission layer is further provided, in addition to the red, green and blue sub-emission layers. Since the green color is highly visible, the additional green sub-emission layer provided in the transmission part T/E improves the light emission efficiency and the brightness efficiency of the transmission part T/E. As described above, a sub-emission layer emitting a light having another color may be additionally provided depending on the demand or requirements of a customer.

Hereinafter, display devices according to sixth to eleventh embodiments of the present invention will be described with reference to cross-sectional views.

Figure 10:
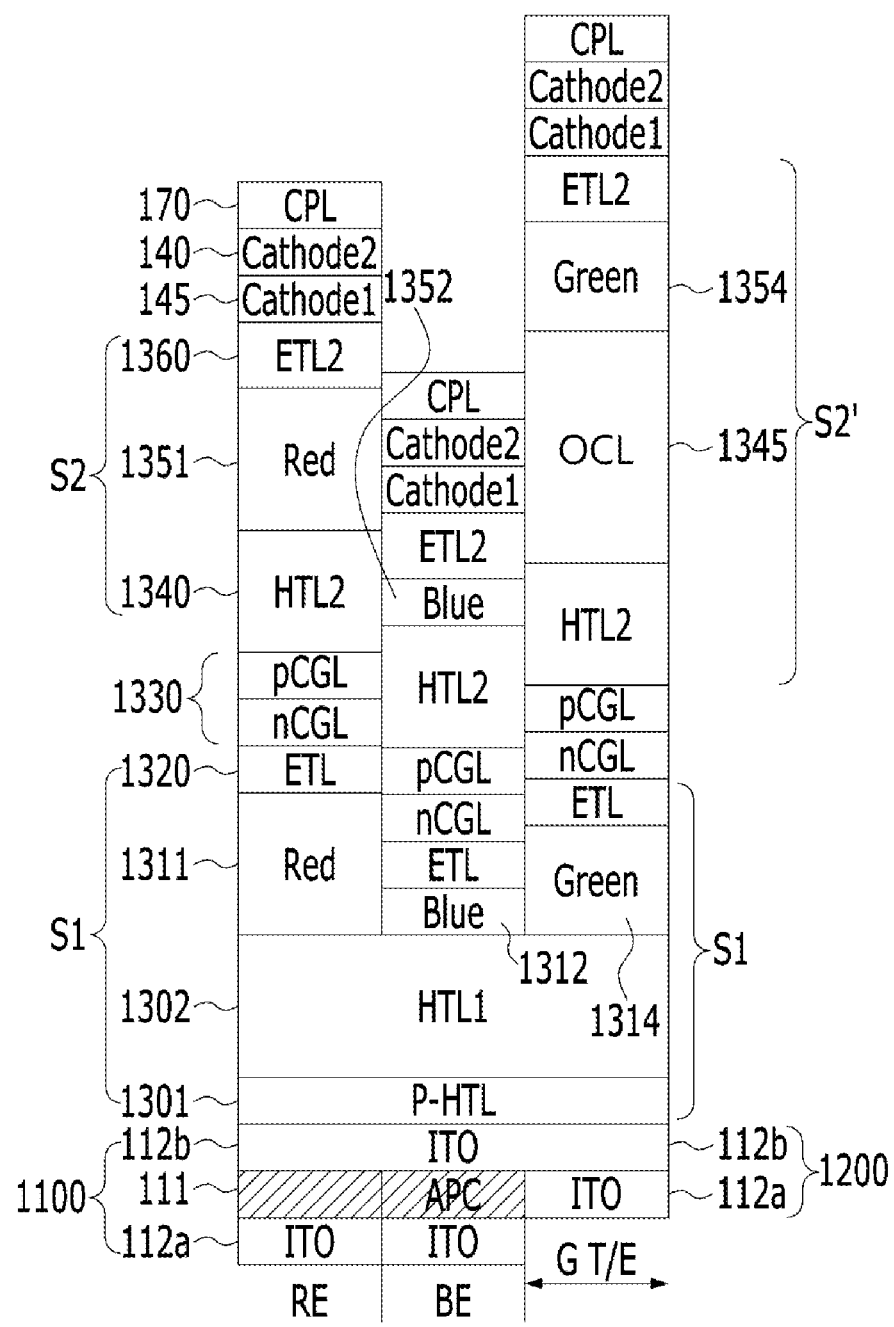
FIGS. 10 to 12 are cross-sectional views of organic light-emitting diodes of display devices according to sixth to eighth embodiments, respectively, of the present invention.
Figure 11:
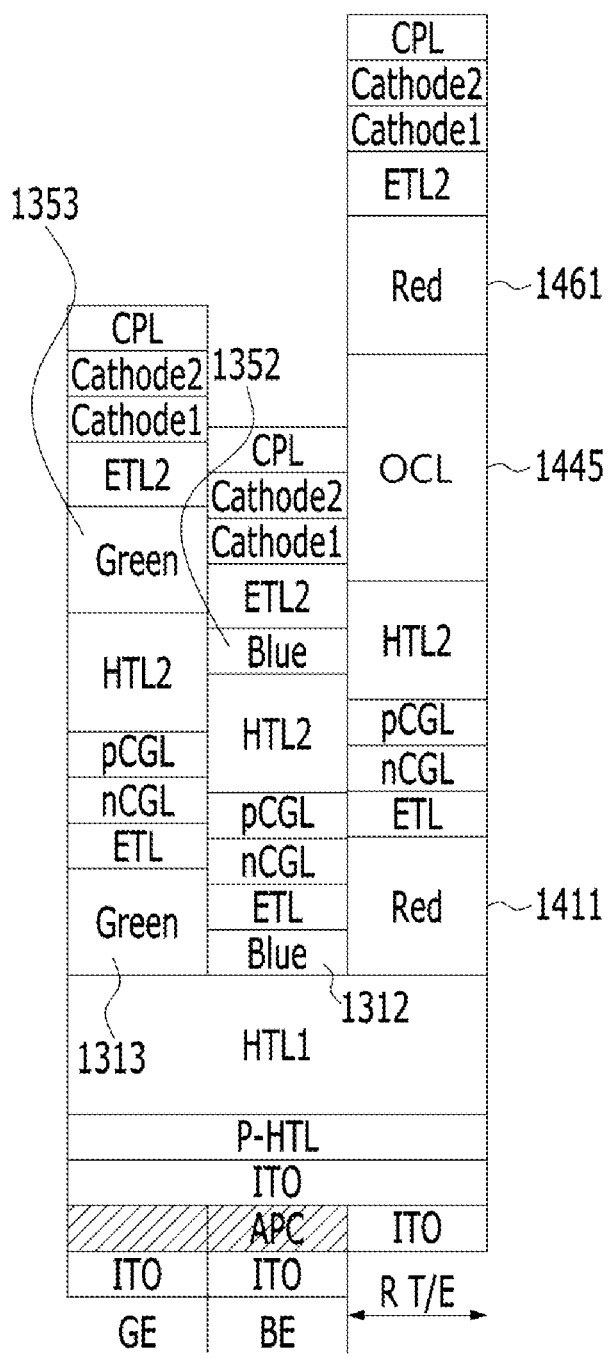
Figure 12:
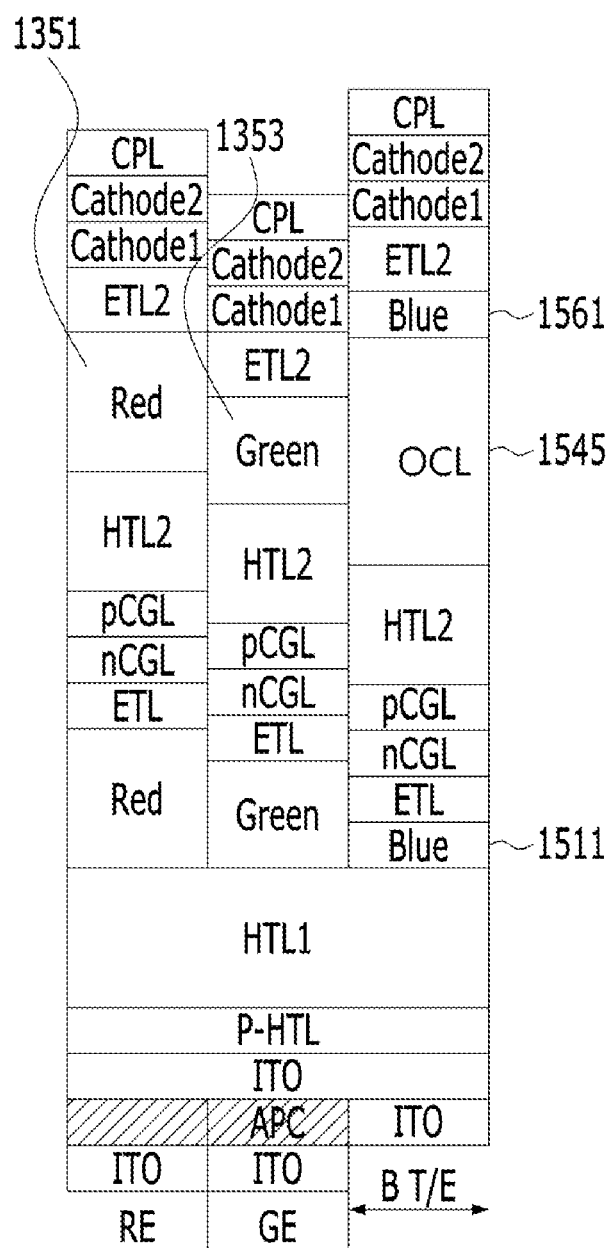

FIGS. 10 to 12 are cross-sectional views of organic light-emitting diodes of display devices according to sixth to eighth embodiments of the present invention.

Sixth Embodiment

As illustrated in FIG. 10, the display device according to the sixth embodiment of the present invention includes multiple stacks, which are arranged as illustrated in the plan view of FIG. 2 and have the same configuration as the modified example illustrated in FIGS. 5A and 5B. FIG. 10 illustrates a red emission part RE, a blue emission part BE, and a transmission part G T/E having a green sub-emission layer. In this case, in addition to the green sub-emission layer, a red sub-emission layer and a blue sub-emission layer may be arranged parallel to each other in a planar manner in the transmission part, as illustrated in FIG. 2.

Each of the red emission part RE and the blue emission part BE is configured such that two stacks S1 and S2 are provided between a reflective anode 1100 and a cathode 140.

The first sub-stack S1 includes a p-type hole transport layer 1301, a first hole transport layer 1302, a first sub-stack emission layer 1311: Red1 (or 1312: Blue1), and a first electron transport layer 1320, which are sequentially arranged.

A charge generation layer 1330, in which an n-type charge generation layer nCGL and a p-type charge generation layer pCGL are stacked, is provided on the first sub-stack S1. The charge generation layer 1330 may be formed in a single-layered structure in which a p-type dopant and an n-type dopant are included in at least one host, or may be formed in a three-layered structure in which a buffer layer (not illustrated) is further provided between the p-type charge generation layer pCGL and the n-type charge generation layer nCGL.

The second stack S2, in which a second hole transport layer 130, a second stack emission layer 1351: Red1 (or 1352: Blue2) and a second electron transport layer 1360 are stacked on one another, is provided on the charge generation layer 1330. That is, the charge generation layer 1330 is disposed between two stacks S1 and S2.

Before the formation of the cathode 140, an auxiliary cathode layer 145, which is formed of an inorganic compound such as LiF and a transmissive or semi-transmissive metal compound having a small work function, may be provided on the second stack S2.

The cathode 140 may be provided on the auxiliary cathode layer 145. A capping layer 170, which is formed of an organic material, may be further provided on the cathode 140 in order to protect the cathode 140 and to improve the extraction of light in the upward direction. Since the auxiliary cathode layer 145 includes metal and is also formed of an inorganic material or an inorganic compound, the auxiliary cathode layer 145 may be included in the constituent elements of the cathode 140.

Before being bonded to the opposite transparent substrate 200 (refer to FIG. 1), the capping layer 170 may be formed of the same material as any one of the layers of the first and second emission units 130 and 130' (refer to FIG. 1) in the final stage of the process of forming the first and second organic light-emitting diodes OLED1 and OLED2. Accordingly, the capping layer 170 may be included in the constituent elements of the first and second organic light-emitting diodes OLED1 and OLED2 in the transmission part T/E and the emission part E.

The emission layers 1311 and 1351 (or 1312 and 1352), which are provided in the first sub-stack S1 and the second sub-stack S2, emit lights having the same color as each other, and thus each sub-pixel emits a light of a single color.

As illustrated in FIG. 10, in the sixth embodiment of the present invention, all of the emission parts RE and BE and the transmission part T/E include the first sub-stacks S1 and the charge generation layers 1330. However, in the transmission part T/E, an optical compensation layer 1345 is further provided between the second hole transport layer 1340 and the second stack emission layer Green2 within the second sub-stack S2 provided on the charge generation layer 1330, and green sub-emission layers 1314 and 1354 are provided as the sub-emission layers.

Here, the red emission layers 1311 and 1351, the blue emission layers 1312 and 1352 and the green sub-emission layers 1314 and 1354 may have different thicknesses from each other in order to adjust the light emission efficiency and the vertical emission region between the anode and the cathode.

Depending on the embodiment, the optical compensation layer 1345 may be disposed in the first sub-stack, rather than in the second sub-stack, or may be provided in all of the first and second sub-stacks.

Further, the optical compensation layer 1345, as illustrated in FIG. 10, may be located so as to be in contact with the bottom surface of the sub-emission layer 1354 or 1314, or may be located so as to be in contact with the top surface of the sub-emission layer 1354 or 1314.

Seventh Embodiment

As illustrated in FIG. 11, the display device according to the seventh embodiment of the present invention includes a green emission part GE, a blue emission part BE, and a red transmission part R T/E.

The seventh embodiment has the same configuration as the sixth embodiment, except that green emission layers 1313 and 1353 are disposed in the green emission part GE, red sub-emission layers 1411 and 1461 are disposed in the transmission part, and an optical compensation layer 1445 is provided so as to be in contact with the red sub-emission layer 1461 in the second stack.

In this case, the display device according to the seventh embodiment of the present invention operates such that the transmission part emits a red light, which is not emitted from the emission part.

Eighth Embodiment

As illustrated in FIG. 12, the display device according to the eighth embodiment of the present invention includes a red emission part RE, a green emission part GE, and a blue transmission part B T/E.

The eighth embodiment has the same configuration as the sixth embodiment, except that green emission layers 1313 and 1353 are disposed in the green emission part GE, blue sub-emission layers 1511 and 1561 are disposed in the transmission part, and an optical compensation layer 1545 is provided so as to be in contact with the blue sub-emission layer 1561 in the second stack.

In this case, the display device according to the eighth embodiment of the present invention operates such that the transmission part emits a blue light, which is not emitted from the emission part.

Figure 13:
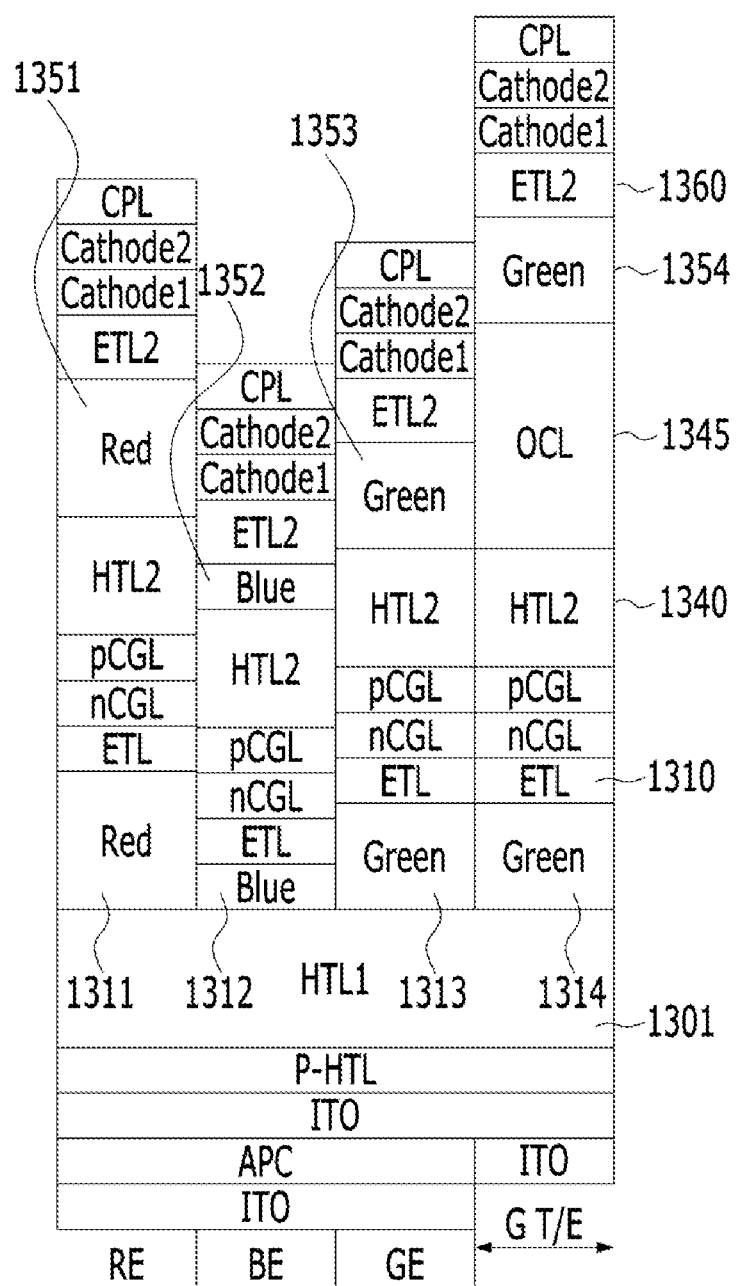
FIGS. 13 to 15 are cross-sectional views of organic light-emitting diodes of display devices according to ninth to eleventh embodiments, respectively, of the present invention.
Figure 14:
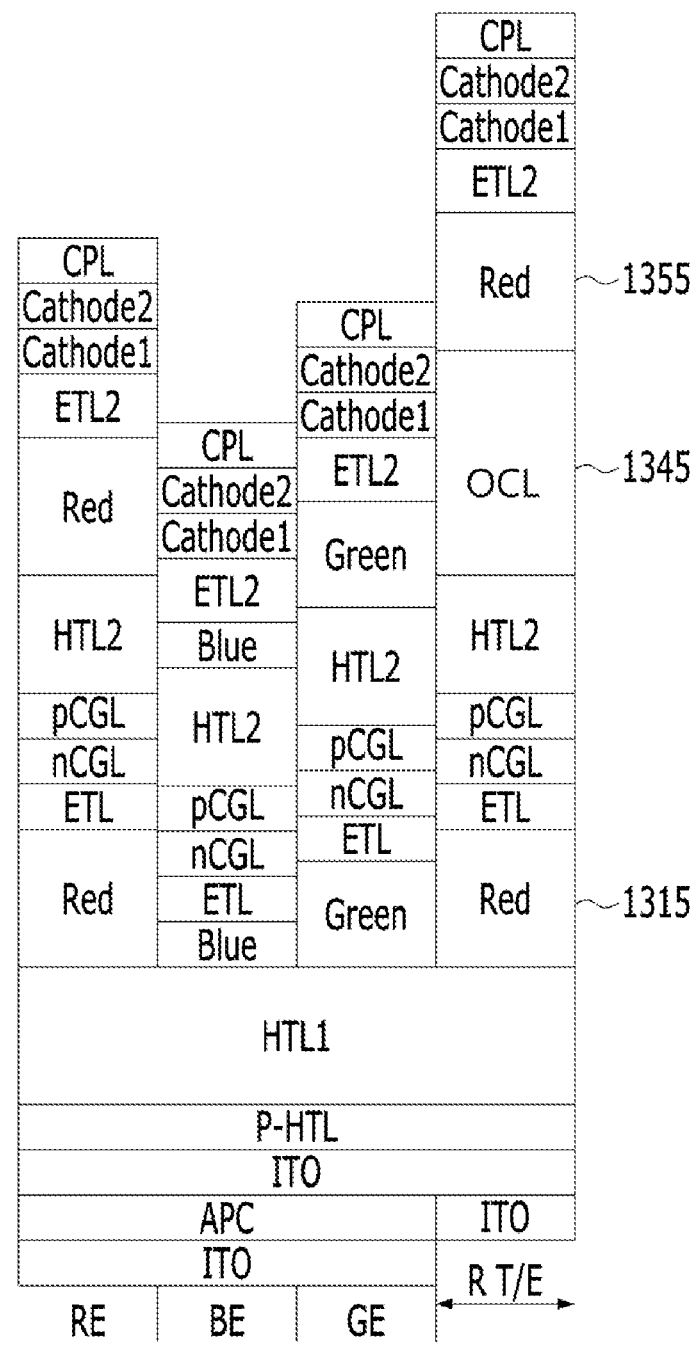
Figure 15:
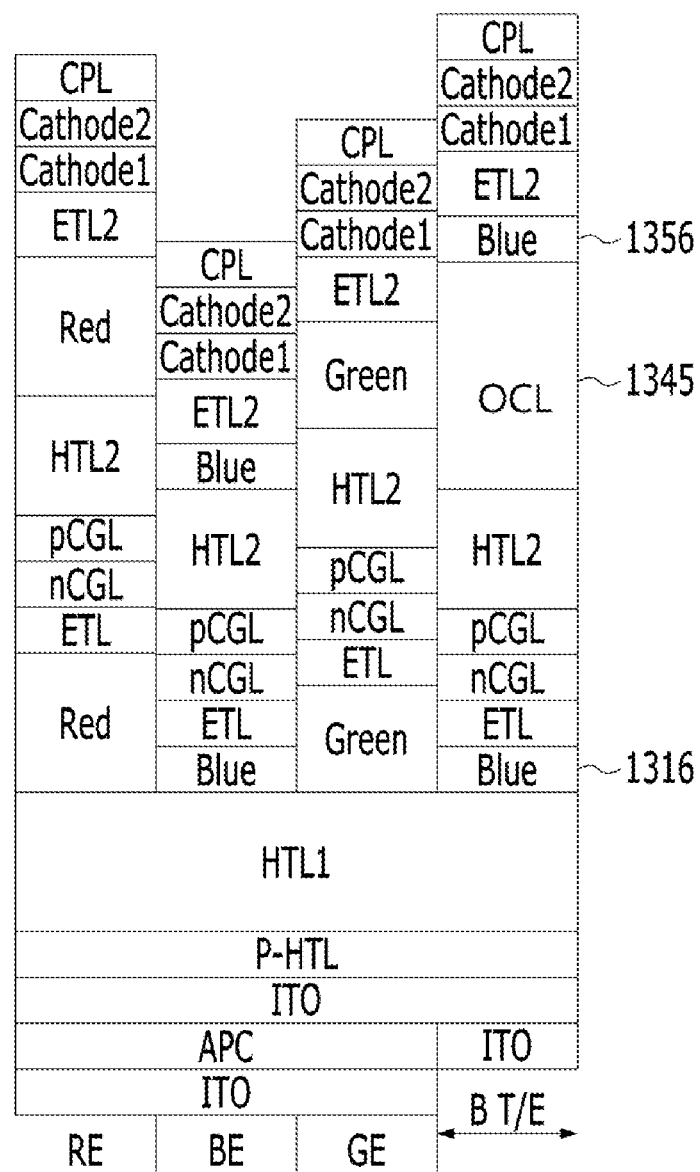

FIGS. 13 to 15 are cross-sectional views of organic light-emitting diodes of display devices according to ninth to eleventh embodiments, respectively, of the present invention.

Ninth Embodiment

As illustrated in FIG. 13, the display device according to the ninth embodiment of the present invention is configured such that a red emission part RE, a green emission part GE and a blue emission part BE are evenly and sequentially arranged and such that a green transmission part G T/E having a green sub-emission layer is provided in order to emphasize a green color. The cross-sectional configuration of each of the emission parts is the same as illustrated in FIGS. 10 and 11 and the cross-sectional configuration of the green transmission part is the same as illustrated in FIG. 10, and thus a description thereof will be omitted.

Tenth Embodiment

As illustrated in FIG. 14, the display device according to the tenth embodiment of the present invention is configured such that a red emission part RE, a green emission part GE and a blue emission part BE are evenly and sequentially arranged and such that a red transmission part R T/E having a red sub-emission layer is provided in order to emphasize a red color. The cross-sectional configuration of each of the emission parts is the same as illustrated in FIGS. 10 and 11 and the cross-sectional configuration of the red transmission part is the same as illustrated in FIG. 13, except that red sub-emission layers 1315 and 1355 are provided in the lower and upper stacks, and thus a description thereof will be omitted.

Eleventh Embodiment

As illustrated in FIG. 15, the display device according to the eleventh embodiment of the present invention is configured such that a red emission part RE, a green emission part GE and a blue emission part BE are evenly and sequentially arranged and such that a blue transmission part B T/E having a blue sub-emission layer is provided in order to emphasize a blue color. The cross-sectional configuration of each of the emission parts is the same as illustrated in FIGS. 10 and 11 and the cross-sectional configuration of the blue transmission part is the same as illustrated in FIG. 13, except that blue sub-emission layers 1316 and 1356 are provided in the lower and upper stacks, and thus a description thereof will be omitted.

In the display devices according to the ninth to eleventh embodiments, the optical compensation layers, which are disposed under the sub-emission layers of the transmission parts, which emit lights having different colors from each other, may have different thicknesses from each other so as to be suitable for the efficiency of emission of respective colors.

The inventor of the present invention has confirmed improvement of the light emission efficiency of the display device having the cross-sectional configuration according to the ninth embodiment of the present invention (refer to FIG. 13), in which the first emission unit having an emission layer has the following configuration in the emission part and the optical compensation layer is formed of the same material as the second hole transport layer in the transmission part.

That is, the first sub-stack S1 includes a p-type hole transport layer 1301, a first hole transport layer 1302, first sub-stack emission layers 1311, 1312 and 1313, and a first electron transport layer 1310. The p-type hole transport layer 1301 is formed to have a thickness of 50 Å, the first hole transport layer 1302 is formed to have a thickness of 400 Å using an NPD material, and the first electron transport layer 1320 is formed to have a thickness of 150 Å using an anthracene-based organic compound. The first sub-stack emission layers 1311, 1312 and 1313 may have different thicknesses from each other. Specifically, the green emission layer 1313 is formed to have a thickness of 400 Å, the red emission layer 1311 is formed to have a thickness of 600 Å to 700 Å, and the blue emission layer 1312 is formed to have a thickness of 150 Å to 250 Å.

The charge generation layer 1330 is formed by stacking an n-type charge generation layer nCGL and a p-type charge generation layer pCGL. The n-type charge generation layer nCGL is formed to have a thickness of 150 Å, and the p-type charge generation layer pCGL is formed to have a thickness of 60 Å.

The second sub-stack S2 includes a second hole transport layer 1340, second sub-stack emission layers 1351, 1352 and 1353, and a second electron transport layer 1360. The second hole transport layer 1340 is formed to have a thickness of 400 Å using an NPD material, and the second electron transport layer 1360 is formed to have a thickness of 300 Å using an anthracene-based compound and an LiQ compound. The second sub-stack emission layers 1351, 1352 and 1353 may have different thicknesses from each other. Specifically, the green emission layer 1353 is formed to have a thickness of 400 Å, the red emission layer 1351 is formed to have a thickness of 600 Å to 700 Å, and the blue emission layer 1352 is formed to have a thickness of 150 Å to 250 Å.

The reflective anode 1100 is formed by stacking a first transparent electrode layer 112a, a reflective electrode 111 and a second transparent electrode layer 112b. In this case, the first and second transparent electrode layers 112a and 112b are formed of indium tin oxide (ITO), and the reflective electrode 111 is formed of an APC (Ag:Pb:Cu) alloy. The first and second transparent electrode layers 112a and 112b are formed to have a thickness of 70 Å, and the reflective electrode 111 is formed to have a thickness of 1000 Å.

The auxiliary cathode layer 145, which is located on the first emission unit 130, is formed to have a thickness of 30 Å using Mg and LiF in a composition ratio of 1:1, and the cathode 140 is formed to have a thickness of 160 Å using Ag and Mg in a composition ratio of 3:1.

The capping layer 170 is formed by depositing an NPD material to a thickness of 650 Å.

The transparent anode 1200, in which the first and second transparent electrode layers 112a and 112b are stacked, is provided in the transmission part. The transmission part has the same stack configuration as the first emission unit 130, except that the optical compensation layer 1345 is further provided under the green sub-emission layer 1354.

In the display device according to the ninth embodiment of the present invention, which includes the emission part and the transmission part configured as described above, the emission part, which is of a top-emission type, may achieve light emission efficiency of 200 Cd/A or greater, and the transmission part having the optical compensation layer may additionally achieve light emission efficiency of 40 Cd/A or greater, thereby improving the light emission efficiency over the entire region of the substrate.

According to the above-described embodiments, lights having colors corresponding to sub-pixels are emitted using the emission layers provided in the transmission parts and the emission parts.

However, the present invention is not limited thereto. The display device of the present invention may be configured such that the transmission part and the emission part have organic stack configurations to thus emit white lights and further include color filter configurations to divide the colors of lights emitted from the emission part and such that a configuration securing the transparency is not provided at the outer sides of the transparent anode and the cathode in the transmission part in order to reduce the loss of light.

A more detailed description will now be made with reference to the drawings.

Twelfth Embodiment

Figure 16:
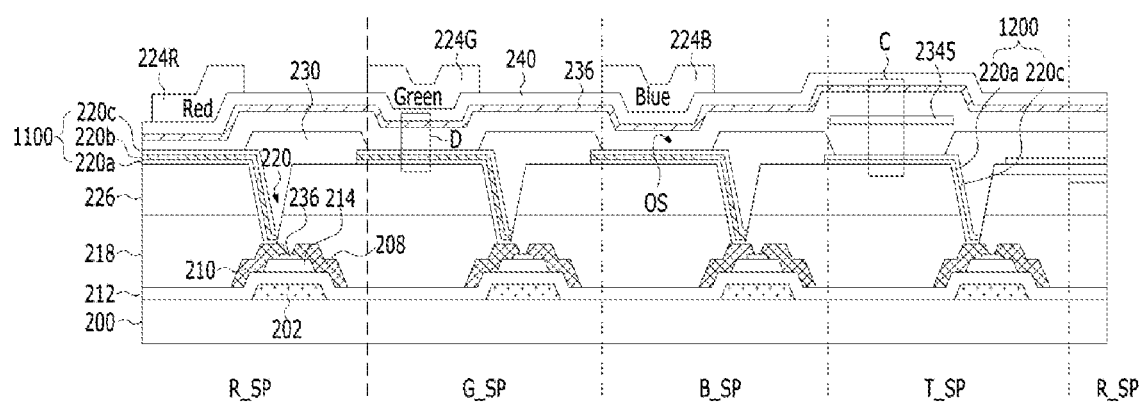
FIG. 16 is a cross-sectional view of a display device according to a twelfth embodiment of the present invention.
Figure 17A:
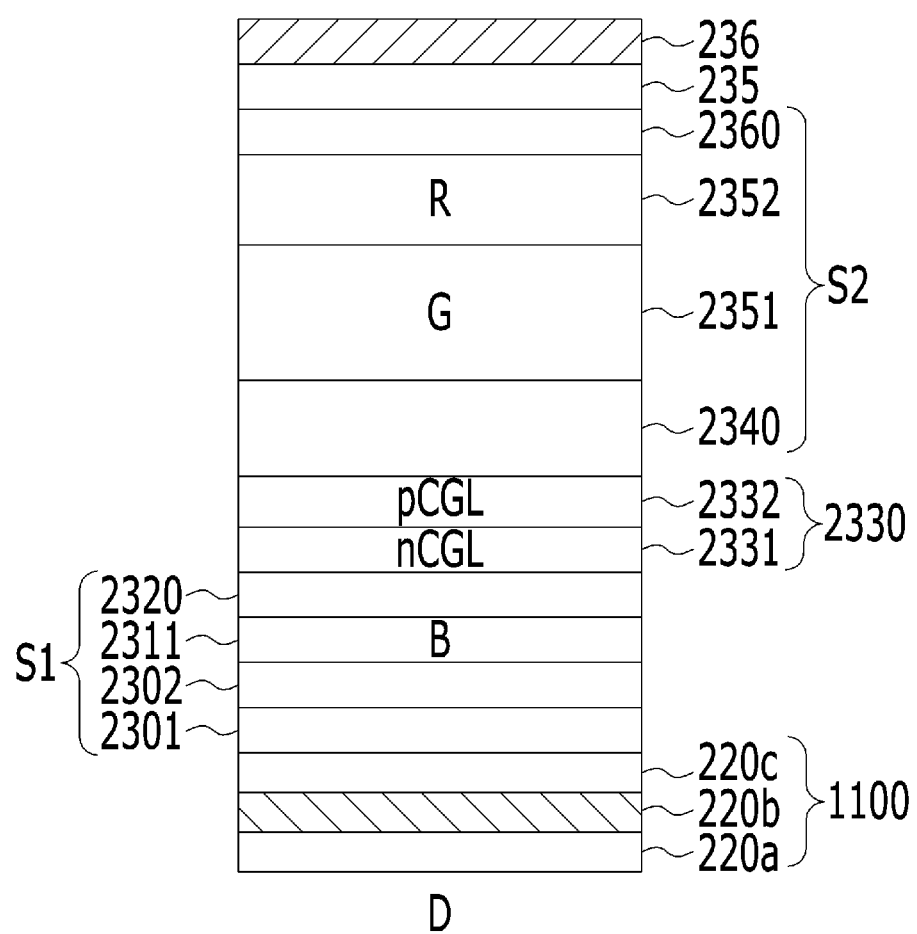
FIGS. 17A and 17B are cross-sectional views of organic light-emitting diodes of an emission part and a transmission part, respectively, shown in FIG. 16.
Figure 17B:
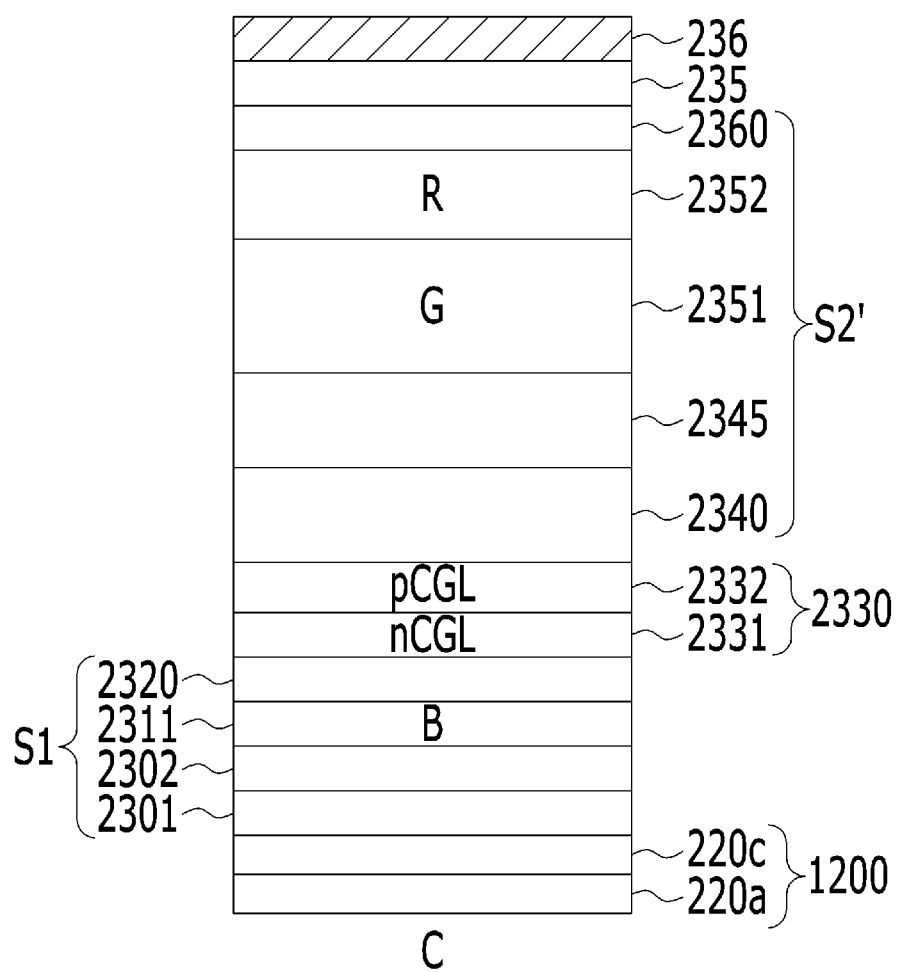

FIG. 16 is a cross-sectional view of a display device according to a twelfth embodiment of the present invention, and FIGS. 17A and 17B are cross-sectional views of organic light-emitting diodes of an emission part and a transmission part, respectively, shown in FIG. 16.

As illustrated in FIG. 16, the display device according to the twelfth embodiment of the present invention is configured such that red, green and blue sub-pixels R_SP, G_SP and B_SP corresponding to emission parts include white organic stacks OS between respective reflective anodes 1100 and a cathode 236 and such that a sub-pixel T_SP of the transmission part includes a white organic stack OS between a transparent anode 1200 and the cathode 236.

In this case, the transparent substrate 200 is divided into the red, green and blue sub-pixels R_SP, G_SP and B_SP and the transparent sub-pixel T_SP. Each of the sub-pixels has a driving thin-film transistor, which includes a gate electrode 202, a semiconductor layer 214, a drain electrode 210 and a source electrode 208, which are connected to both sides of the semiconductor layer 214, and an etch stopper 236, which corresponds to a channel portion of the semiconductor layer 214 and is in contact with the semiconductor layer 214.

In addition, a gate insulation film 212 is provided between the gate electrode 202 and the semiconductor layer 214. A first protective film 218 and a second protective film 226 are provided in a region, other than a contact hole 220, between the driving thin-film transistor and the reflective anode 1100.

The reflective anode 1100 is formed by stacking a first transparent electrode layer 220a, a reflective electrode layer 220b and a second transparent electrode layer 220c on one another. The transparent anode 1200 includes the first and second transparent electrode layers 220a and 220c without the reflective electrode layer 220b.

Bank layers 230 are provided between the reflective anode 1100 and the white organic stack OS and between the transparent anode 1200 and the white organic stack OS, thereby defining the respective sub-pixels.

A capping layer 240 is formed on the cathode 236 in order to secure the extraction of light and to protect the organic light-emitting diodes. The red, green and blue sub-pixels R_SP, G_SP and B_SP, which correspond to the emission parts, include red, green and blue color filters 224R, 224G and 224B provided on the capping layer 240.

As illustrated in FIGS. 17A and 17B, in the display device according to the twelfth embodiment of the present invention, each of the emission part and the transmission part realizes a white color using two white organic stacks.

As illustrated in FIG. 17A, each of the red, green and blue sub-pixels R_SP, G_SP and B_SP, which correspond to the emission parts, includes: a first sub-stack S1, which includes a p-type hole transport layer 2301, a first hole transport layer 2302, a blue emission layer 2311, and a first electron transport layer 2320; a charge generation layer 2330, in which an n-type charge generation layer nCGL and a p-type charge generation layer pCGL are stacked; a second sub-stack S2, which includes a second hole transport layer 2340, a green emission layer 2351, a red emission layer 2352, a second electron transport layer 2360, and an auxiliary cathode layer 235; and a cathode 236. The first sub-stack S1, the charge generation layer 2330, the second sub-stack S2 and the cathode 236 are sequentially stacked on the reflective anode 1100.

As illustrated in FIG. 17B, the transparent sub-pixel T_SP, which corresponds to the transmission part, further includes an optical compensation layer 2345, which is in contact with the bottom surface of the green emission layer 2351 in the second sub-stack S2'.

The transparent sub-pixel T_SP includes the emission layer, but does not include a color filter in order to secure transparency.

In the stack, the combination of the red, green and blue emission layers may be substituted with the combination of magenta, yellow and cyan emission layers, or may be substituted with the combination of emission layers emitting lights having other colors to realize a white light. Alternatively, the green emission layer and the red emission layer, which are stacked in the second stack S2', may be substituted with yellow green emission layers, and the emission layers may be formed in the shape of multiple layers that have different dopant concentrations from each other.

In addition, in the twelfth embodiment of the present invention, the optical compensation layer 2345 is provided in the transparent sub-pixel T_SP so as to correspond to the red, green and blue sub-pixels SP of the emission parts, thereby compensating for the difference between the resonance between the reflective anode and the cathode and the resonance between the transparent anode and the cathode and the difference in the extraction of light between top emission and dual emission.

In the case in which the transmission part and the emission part commonly include the white organic stack, the organic stack is configured such that an opening portion does not correspond to a specific region in the active area, thereby omitting the use of a fine metal mask and facilitating the process.

Depending on the embodiment, the illustrated mask may be changed to the shape described above with reference to FIG. 3.

In the case in which each sub-pixel includes a white organic emission stack emitting a white light like the display device according to the twelfth embodiment of the present invention, the light emission efficiency of the entire display device may be improved, and the display device may be effectively used for an application requiring high brightness.

Thirteenth Embodiment

Figure 18A:
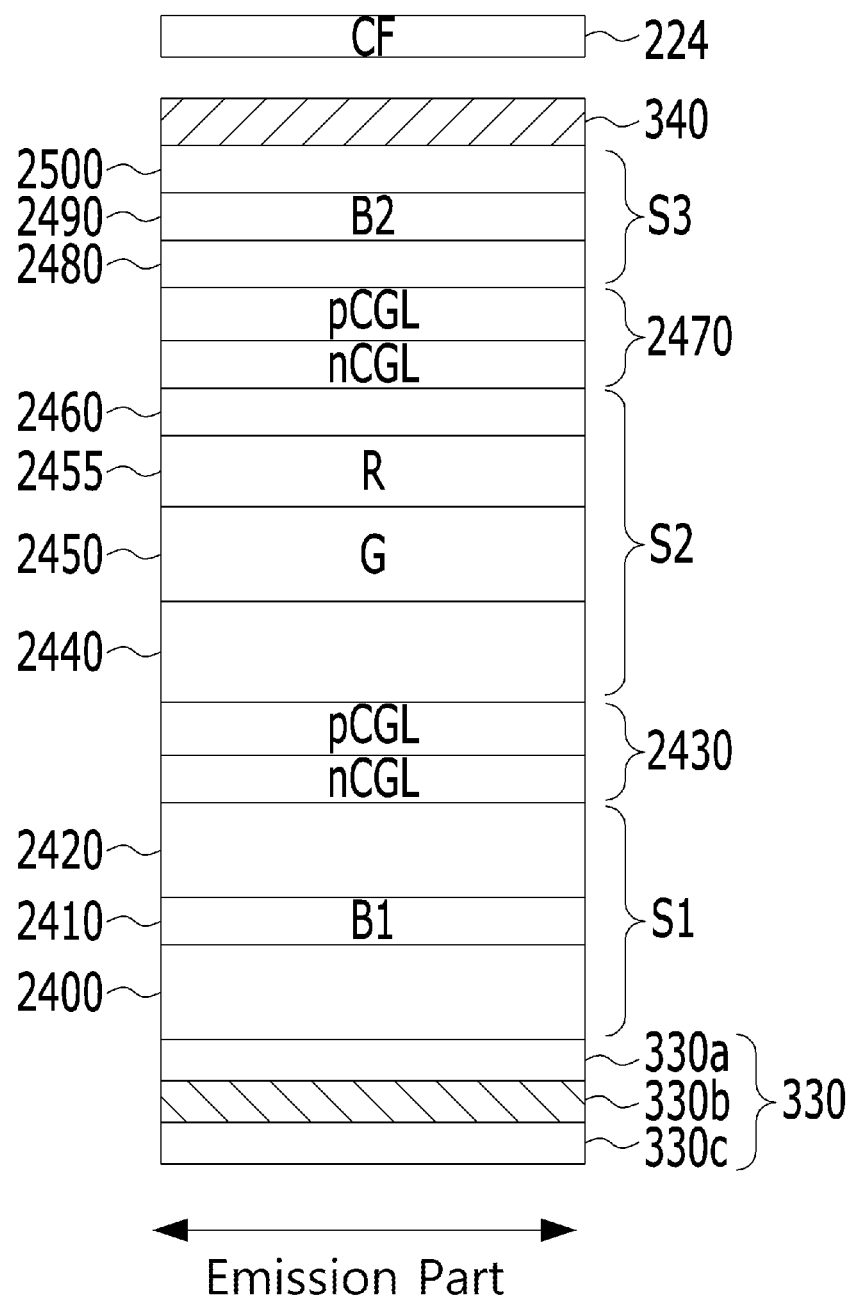
FIGS. 18A and 18B are cross-sectional views illustrating organic light-emitting diodes of an emission part and a transmission part, respectively, of a display device according to a thirteenth embodiment of the present invention.
Figure 18B:
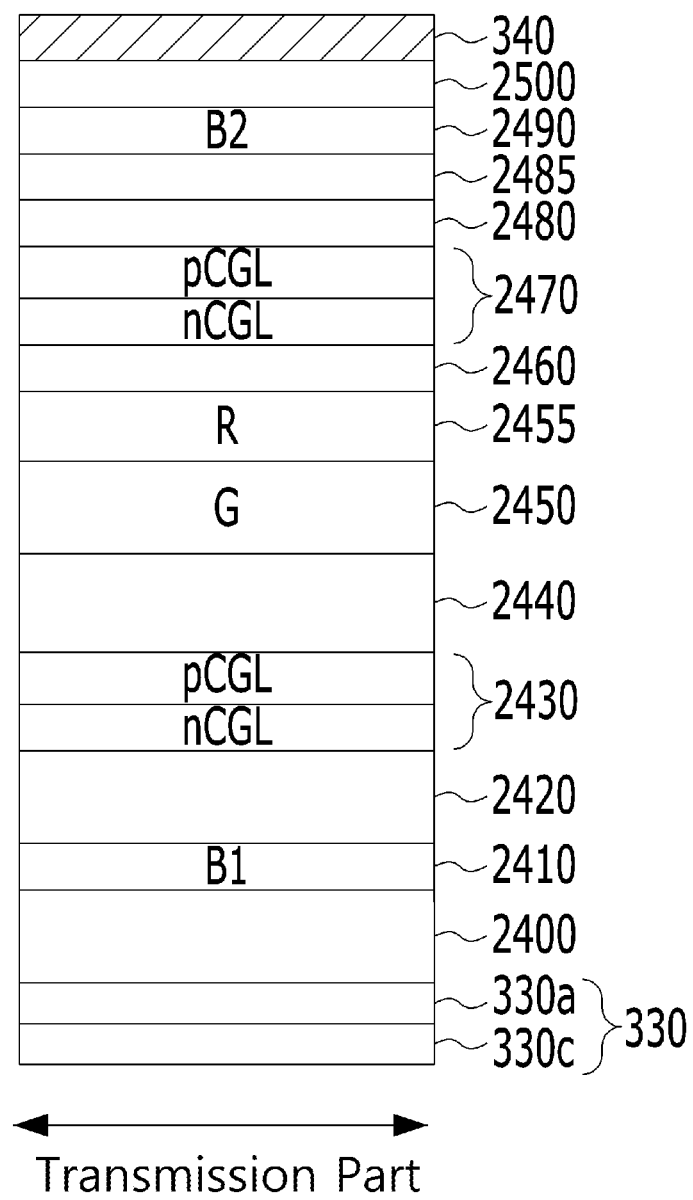

FIGS. 18A and 18B are cross-sectional views illustrating organic light-emitting diodes of an emission part and a transmission part of a display device according to a thirteenth embodiment of the present invention.

The above-described twelfth embodiment realizes a white color using two white organic stacks, whereas the display device according to the thirteenth embodiment of the present invention realizes a white color using three white organic stacks.

As illustrated in FIG. 18A, in the display device according to the thirteenth embodiment of the present invention, each of the red, green and blue sub-pixels R_SP, G_SP and B_SP, which correspond to the emission parts, includes: a first sub-stack S1, which includes a first hole transport layer 2400, a first blue emission layer 2410, and a first electron transport layer 2420; a first charge generation layer 2430, in which an n-type charge generation layer nCGL and a p-type charge generation layer pCGL are stacked; a second sub-stack S2, which includes a second hole transport layer 2440, a green emission layer 2450, a red emission layer 2455, and a second electron transport layer 2460; a second charge generation layer 2470, in which an n-type charge generation layer nCGL and a p-type charge generation layer pCGL are stacked; a third sub-stack S3, which includes a third hole transport layer 2480, a second blue emission layer 2490 and a third electron transport layer 2500; and a cathode 340. The first sub-stack S1, the first charge generation layer 2430, the second sub-stack S2, the second charge generation layer 2470, the third sub-stack S3 and the cathode 340 are sequentially stacked on the reflective anode 330. In the emission part, a color filter 224 is located on the cathode 340 in order to realize each color of the sub-pixel.

As illustrated in FIG. 18B, the transparent sub-pixel T_SP corresponding to the transmission part has the same white organic stack configuration as the emission part, except that the transparent sub-pixel T_SP includes an optical compensation layer 2485, which is in contact with the bottom surface of the second blue emission layer 2490 in the third sub-stack S3. The optical compensation layer 2485 is provided in the transparent sub-pixel T_SP so as to correspond to the red, green and blue sub-pixels SP of the emission parts, thereby compensating for the difference between the resonance between the reflective anode and the cathode and the resonance between the transparent anode and the cathode and the difference in the extraction of light between top emission and dual emission.

Although the optical compensation layer 2485 is illustrated as being provided in the uppermost sub-stack, the present invention is not limited thereto. The optical compensation layer 2485 may be provided in another sub-stack or in a plurality of stacks. The arrangement of the optical compensation layer 2485 may be adjusted in consideration of the efficiency and transparency of the corresponding transparent sub-pixel.

The transparent sub-pixel T_SP includes the emission layer, but does not include a color filter in order to secure transparency.

The thirteenth embodiment of the present invention, which includes the three sub-stacks, has more improved light emission efficiency than the twelfth embodiment.

The display device of the present invention may be formed in various shapes, and may be applied to mobile devices or vehicles. Further, the transparent substrate 100 or 200 may be formed of a flexible material so as to be flexible and thus to facilitate mounting and demounting thereof.

An example, in which the display device of the present invention performs transparent display and is applied to a vehicle, will be described below.

Figure 19:
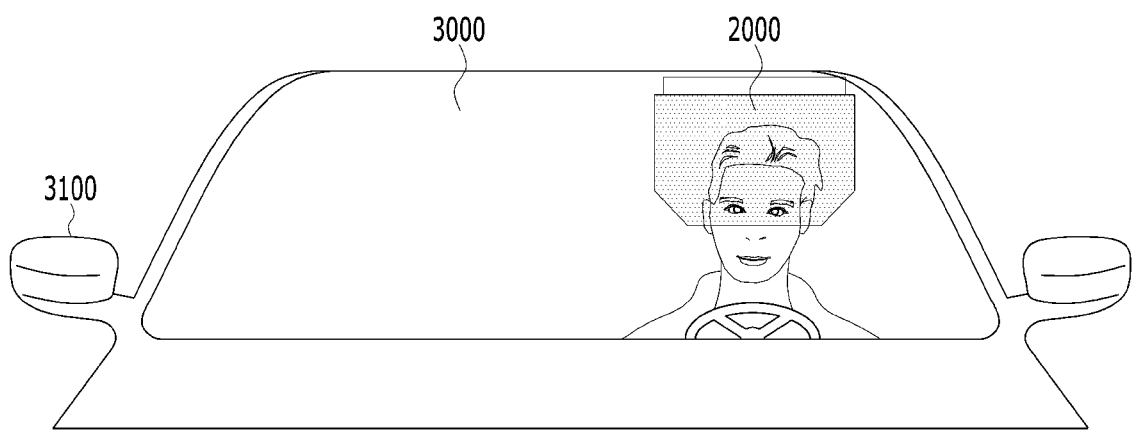
FIG. 19 is a view illustrating a usage example of the display device of the present invention.

FIG. 19 is a view illustrating a usage example of the display device of the present invention.

As illustrated in FIG. 19, the transparent substrate 100 or 200 of the display device of the present invention (refer to FIGS. 1 to 18) may be attached to at least one of a dashboard, a head-up display device 2000, a front window 3000, a room mirror (not illustrated), or a side mirror 3100 of a vehicle. In this case, the display device mounted in the vehicle may be used as a device for providing information to a driver.

The first thin-film transistor and the second thin-film transistor for driving the emission part and the transmission part disposed on the transparent substrate 100 are driven by receiving power from a battery mounted in the vehicle, and subsequently the first and second organic light-emitting diodes are driven by receiving current. Since the display device of the present invention has high light emission efficiency, it is capable of displaying information with high brightness and improved visibility even when a user is outdoors. Further, the active area of the display device is evenly used for light emission, thereby preventing degradation of a specific region in the display device and improving the lifespan thereof.

The usage example of the display device of the present invention shown in FIG. 19 is merely illustrative. The present invention is not limited thereto. The display device of the present invention may be used for any devices requiring information display with certain transparency.

As is apparent from the above description, a panel, a display device and a vehicle-mounted display device according to the present invention have the following effects.

First, in the display device of the present invention, which includes a transparent substrate for transparent display, since the transmission part also includes an organic light-emitting diode for light emission, most of the region of the substrate is used as an emission region. Thus, it is possible to extend the lifespan of the display device, compared to a conventional transparent display device in which only an emission part emits light and an organic light-emitting diode of the emission part is continuously driven. That is, since most of the region of the substrate is used for light emission, current density per unit area is reduced, and thus the lifespan of the display device is lengthened.

Second, since both the emission part and the transmission part are capable of emitting light, the light emission efficiency of the display device is improved.

Third, since the transmission part includes multiple sub-emission layers emitting lights having different colors from each other, it is possible to obtain light emission effect from the emission part and the transmission part at the same time, thereby extending the lifespan of the emission layers provided in the emission part and the transmission part.

Fourth, unlike the electrode structure of the emission part, the electrode structure of the transmission part is formed such that transparent electrodes are disposed so as to face each other in order to perform transparent display.

Fifth, the organic light-emitting diode of the transmission part includes an optical compensation layer, which is disposed in the transparent electrode structure and is formed to be thicker than the emission layer, thereby improving the color sense of the light emitted from the transmission part.

It will be apparent to those skilled in the art that various modifications and variations can be made in the present invention without departing from the spirit or scope of the invention. Thus, it is intended that the present invention covers the modifications and variations of this invention provided they come within the scope of the appended claims and their equivalents.

What is claimed is:

1. A display panel having a plurality of emission parts and a plurality of transmission parts, the display panel comprising:
   a transparent substrate;
   a reflective anode in each of the emission parts;
   a transparent anode in each of the transmission parts;
   a first emission unit on the reflective anode;
   a second emission unit on the transparent anode; and
   a cathode on both the first emission unit and the second emission unit,
   wherein at least one of the plurality of transmission parts includes a plurality of sub-emission parts at least some of which emitting lights having different colors from each other,
   wherein the plurality of sub-emission parts comprise first, second, and third sub-emission layers configured to emit lights having first, second, and third wavelengths, respectively, the first wavelength being shorter than the second wavelength, and the second wavelength being shorter than the third wavelength, and
   wherein the transmission parts include more second sub-emission layers than the first and third sub-emission layers.

2. The display panel according to claim 1, wherein the plurality of emission parts include first, second, and third emission parts include first, second, and third emission layers, respectively, configured to emit lights having different colors from each other, and
   wherein each of the first, second, and third emission layers has a same host and a same dopant as a corresponding one of the first, second, and third sub-emission layers, respectively, in the transmission parts.

3. The display panel according to claim 2, wherein a first organic common layer and a second organic common layer are continuously provided under and on the first, second, and third emission layers, respectively, in the first emission unit and under and on the first to third sub-emission layers respectively, in the second emission unit.

4. The display panel according to claim 1, wherein the plurality of emission parts include a first emission part and a second emission part configured to emit lights having different colors from each other,
   wherein the first emission part and the second emission part comprise first and second emission layers, respectively, in the first emission unit, and
   wherein each of the first and second emission layers has a same host and a same dopant as a corresponding one of any two of the first, second, and third sub-emission layers in the transmission part.

5. The display panel according to claim 4, wherein a first organic common layer and a second organic common layer are continuously provided under and on the first and second emission layers, respectively, in the first emission unit and under and on the first, second, and third sub-emission layers, respectively, in the second emission unit.

6. The display panel according to claim 1, wherein each of the first emission unit and the second emission unit comprises multiple stacks separated by at least one charge generation layer, and
   wherein the stacks vertically disposed in each of the emission parts and the transmission parts comprise emission layers configured to emit lights having a same color as each other.

7. The display panel according to claim 1, wherein the first or the third sub-emission layer in the transmission parts occupies a smaller area than second sub-emission layer.

8. The display panel according to claim 1, wherein the second sub-emission layer in the transmission parts occupies a larger area than first sub-emission layer or the third sub-emission layer.

9. The display panel according to claim 1, wherein the second emission unit further comprises an optical compensation layer.

10. The display panel according to claim 1, wherein the second emission unit further comprises first, second, and third optical compensation layers in contact with the first, second, and third sub-emission layers, respectively.

11. The display panel according to claim 10, wherein the first, second, and third optical compensation layers have different thicknesses from each other.

12. The display panel according to claim 1, wherein each of the first emission unit and the second emission unit comprises an organic stack configured to emit a white light, and
    wherein at least one color filter is provided on the cathode so as to correspond to the emission parts.

13. The display panel according to claim 12, wherein the organic stack comprises multiple stacks separated by at least one charge generation layer, and
    wherein a plurality of emission layers configured to emit lights having different colors from each other are stacked in at least one of the stacks.

14. The display panel according to claim 13, wherein the second emission unit further comprises an optical compensation layer provided in at least one of the stacks.

15. The display panel according to claim 13, wherein the multiple stacks comprise the at least one charge generation layer and the emission layers are continuously formed in the first emission unit and the second emission unit without separation.

16. The display panel according to claim 1, wherein the transmission parts, included in the transparent substrate, have a total area greater than a total area of the emission parts.

17. A display device comprising:
    the display panel according to claim 1;
    a first thin-film transistor electrically connected to the reflective anode; and
    a second thin-film transistor electrically connected to the transparent anode,
    wherein the first thin-film transistor and the second thin-film transistor are provided in a region other than the transmission parts.

18. The display device according to claim 17, further comprising:
    a bank layer between adjacent ones of the transmission parts, between adjacent ones of the emission parts, and between the transmission parts and the emission parts,
    wherein the bank layer is interposed between a layer of the transparent anode and the reflective anode and a stack of the first emission unit and the second emission unit.

19. The display device according to claim 18, wherein the first thin-film transistor and the second thin-film transistor are overlapped with any one of the bank layer or the first emission unit.

20. The display device of claim 17, wherein the display device is mounted in a vehicle.

21. The display device according to claim 20, wherein the first thin-film transistor and the second thin-film transistor are configured to receive power from a battery provided in the vehicle.

22. The display device according to claim 21, wherein the display panel is configured to be attached to at least one of a dashboard, a removable display, a head-up display device, a front window, a room mirror, or a side mirror of the vehicle.

* * * * *